(12) United States Patent
Sallak

(10) Patent No.: US 10,890,852 B2
(45) Date of Patent: Jan. 12, 2021

(54) SIGNAL RECOGNITION DURING SUBSTRATE PATTERNING VIA DIGITAL PHOTOLITHOGRAPHY

(71) Applicant: Applied Materials, Inc., Santa Clara, CA (US)

(72) Inventor: Rashid M. Sallak, Dublin, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/599,660

(22) Filed: Oct. 11, 2019

(65) Prior Publication Data
US 2020/0150548 A1 May 14, 2020

Related U.S. Application Data

(60) Provisional application No. 62/757,581, filed on Nov. 8, 2018.

(51) Int. Cl.
*G03F 7/20* (2006.01)
(52) U.S. Cl.
CPC ............ *G03F 7/70641* (2013.01); *G03F 7/20* (2013.01)
(58) Field of Classification Search
CPC ............ G03F 7/70775; G03F 7/70641; G03F 9/7026; G03F 7/7085; G03F 7/70666; G03F 7/70716; G03F 9/70; G03F 9/7084; G03F 7/20; G03F 9/7003; G03F 7/70358; G03F 2009/005; G03F 1/44; G03F 9/7034; G03F 7/707; G03F 7/706; G03F 7/70758; G03F 9/7023; G03F 7/70558; G03F 7/70391; G03F 7/70491; G03F 7/0441; G03F 1/36; G03F 7/705; G03F 21/956;
(Continued)

(56) References Cited

U.S. PATENT DOCUMENTS 6,444,995 B1 9/2002 Cho
2011/0304838 A1 12/2011 Huang et al.
(Continued)

FOREIGN PATENT DOCUMENTS

EP 1653280 A1 5/2006
JP 2005311057 A 11/2005

OTHER PUBLICATIONS

International Search Report and the Written Opinion for International Application No. PCT/US2019/055865 dated Jan. 29, 2019, 10 pages.

*Primary Examiner* — Mesfin T Asfaw
(74) *Attorney, Agent, or Firm* — Patterson + Sheridan LLP

(57) ABSTRACT

Embodiments of the present disclosure are related to systems and methods for autofocusing an imaging apparatus in real-time during substrate scanning to pattern a substrate that includes a photoresist formed over one or more patterned materials. Displays of varying sizes can be fabricated using digital photolithography systems. The digital photolithography systems discussed herein, which may be referred to as imaging systems, use one or more exposure sources, including solid state emitter devices, for operations including patterning photoresists. Signal classifiers are used to perform shape and pattern recognition to determine whether signals received during substrate scanning are from a top photoresist surface or from sub-surface layers. One or more parameters of the imaging apparatus can be adjusted or maintained based on the signal analysis.

20 Claims, 10 Drawing Sheets

(58) Field of Classification Search
CPC ............. G03F 7/70633; G03F 7/70291; G03F 7/70608; G03F 7/2002; G03F 7/70616; G03F 7/7065; H01L 21/68; H01L 21/67288; H01L 22/12; H01L 2224/0401; H01L 2224/16146; H01L 2224/16227; H01L 2225/06513; H01L 2225/06517; H01L 2924/351; H01L 2224/75753; H01L 27/14687; H01L 22/20; H01L 31/1013; G01N 21/956
See application file for complete search history.

(56) References Cited

U.S. PATENT DOCUMENTS

| | | | |
|---|---|---|---|
| 2016/0035538 A1* | 2/2016 | Fukuda | H01J 37/285 250/307 |
| 2018/0188655 A1 | 7/2018 | Chen et al. | |

* cited by examiner

SIGNAL RECOGNITION DURING SUBSTRATE PATTERNING VIA DIGITAL PHOTOLITHOGRAPHY

CROSS-REFERENCE TO RELATED APPLICATIONS

This application claims benefit of U.S. provisional patent application Ser. No. 62/757,581, filed Nov. 8, 2018, which is herein incorporated by reference.

BACKGROUND

Field

Embodiments of the present disclosure generally relate to apparatuses, systems, and methods for processing one or more substrates, and more specifically to apparatuses, systems, and methods for performing photolithography processes.

Description of the Related Art

Photolithography is widely used in the manufacturing of semiconductor devices and display devices, such as liquid crystal displays (LCDs). Large area substrates are often utilized in the manufacture of LCDs. LCDs, or flat panels, are commonly used for active matrix displays, such as computers, touch panel devices, personal digital assistants (PDAs), cell phones, television monitors, and the like. Generally, flat panels include a layer of liquid crystal material forming pixels sandwiched between two plates. When power from a power supply is applied across the liquid crystal material, an amount of light passing through the liquid crystal material is controlled at pixel locations enabling images to be generated.

Microlithography techniques have been employed to create electrical features incorporated as part of the liquid crystal material layer forming the pixels. According to these techniques, a light-sensitive photoresist is applied to at least one surface of the substrate. Then, a pattern generator exposes selected areas of the light-sensitive photoresist as part of a pattern with light to cause chemical changes to the photoresist in the selective areas to prepare these selective areas for subsequent material removal and/or material addition processes to create the electrical features. The substrates patterned during microlithography can have a variation in thickness across the substrate that is greater than the degrees of freedom of the microlithography system. This can lead to the system being out of focus with respect to the substrate and results in a blurring of one or more pixels in the display which can lead to mura or other undesirable effects in the display.

In order to continue to provide display devices and other devices at the prices demanded by consumers, new apparatuses and approaches are needed to precisely and cost-effectively create patterns on substrates, such as large area substrates, including apparatuses and approaches for real-time autofocusing of the imaging apparatus during substrate scanning.

SUMMARY

Embodiments of the present disclosure are related to systems and methods for autofocusing an imaging apparatus in real-time during substrate scanning to pattern a substrate that includes a photoresist formed over one or more patterned materials. Displays of varying sizes can be fabricated using digital photolithography systems. The digital photolithography systems discussed herein, which may be referred to as imaging systems, use one or more exposure sources, including solid state emitter devices, for operations including patterning photoresists. Signal classifiers are used to perform shape and pattern recognition to determine whether signals received during substrate scanning are from a top photoresist surface or from sub-surface layers. One or more parameters of the imaging apparatus can be adjusted or maintained based on the signal analysis.

In one embodiment, a method of patterning a substrate using an imaging apparatus comprises applying, based on an imaging program stored in a non-transitory memory of an imaging apparatus and executable by a processor, a plurality of laser beams from the imaging apparatus across at least a portion of a substrate, the substrate being disposed on a stage in the imaging apparatus in an initial position and receiving, by a plurality of sensors of the imaging apparatus, in response to applying the plurality of laser beams, a plurality of signals, each signal being defined by a plurality of shape descriptors. The method further includes determining if a first signal of the plurality of signals received from the substrate is received from a top surface of the substrate; and at least one of: in response to the determination that the first signal was not received from the top surface of the substrate, maintaining the initial position of the stage; in response to the determination that the first signal was not received from the top surface of the substrate, transforming the first signal; in response to the determination that the first signal was received from the top surface of the substrate, adjusting the initial position of the stage to a second position; or in response to the determination that the first signal was received from the top surface of the substrate, maintaining the initial position of the stage.

In another embodiment, a method of patterning a substrate using an imaging apparatus comprises applying, based on an imaging program executed by a processor of the imaging apparatus, a plurality of laser beams from the imaging apparatus across at least a portion of a substrate while the substrate is disposed on a stage in the imaging apparatus in an initial position. The method further includes receiving, by a plurality of sensors coupled to the imaging apparatus, in response to applying the plurality of laser beams, a plurality of signals, each signal being defined by a plurality of shape descriptors and including at least one peak; and applying a first classifier from the imaging program to a first signal of the plurality of signals to determine if the first signal is associated with a first class. Furthermore in the embodiment, the method includes applying a second classifier from the imaging program to the first signal to determine if the first signal is associated with a second class. Based upon the applying of the first classifier and the second classifier to the first signal, the method includes one of: in response to a determination that first signal is associated with the second class, maintaining the initial position of the substrate; or in response to a determination that first signal is associated with the first class, determining if a location of a top surface of the substrate is within a predetermined distance range from the exposure source.

In yet another embodiment, a non-transitory computer-readable medium including instructions that are configured to cause a computing system to: apply a plurality of laser beams from an imaging apparatus across at least a portion of a substrate, the substrate being disposed on a stage in an initial position, the imaging apparatus being communicatively coupled to the computing system; receive, by a plurality of sensors of the imaging apparatus, in response to applying the plurality of laser beams, a plurality of signals, each signal being defined by a plurality of shape descriptors and determine if a first signal of the plurality of signals is associated with a first class of a plurality of classes, wherein each class of the plurality of classes is associated with a composition of the substrate. Further in the embodiment, the instructions are further configured to cause the computing system to at least one of: maintain the initial position of the substrate in response to the determination indicating that the first signal is not associated with the first class; transform the first signal in response to the determination indicating that the first signal is not associated with the first class; or adjust the initial position to a second position in response to the determination indicating that the first signal is associated with the first class.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Figure 1A:
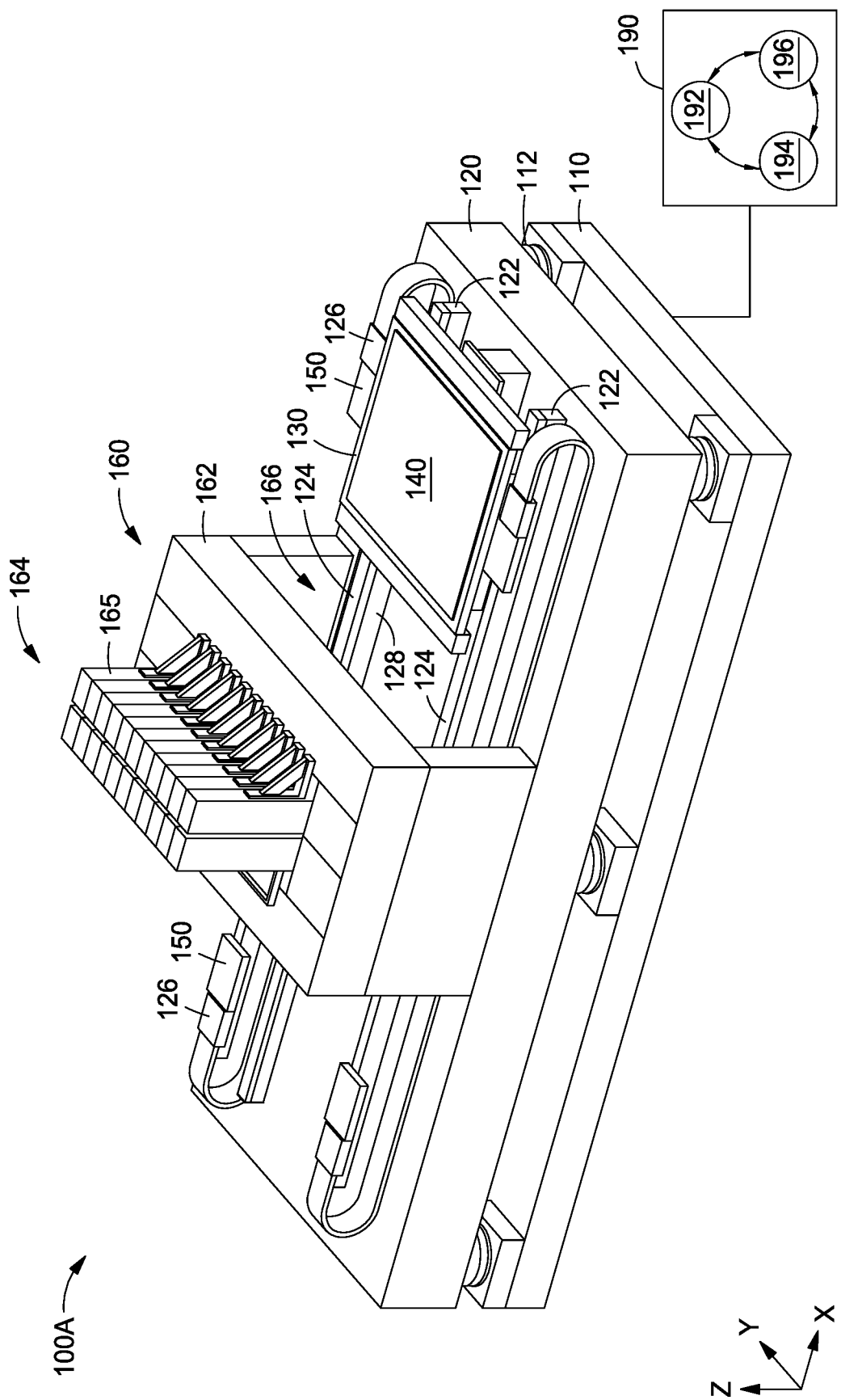
FIG. 1A is a perspective view of a photolithography system according to embodiments of the present disclosure.

Embodiments of the present disclosure are related to systems and methods for autofocusing an imaging apparatus in real-time during substrate scanning to pattern a substrate that includes a photoresist formed over one or more patterned materials. Displays of varying sizes can be fabricated using digital photolithography systems. The digital photolithography systems discussed herein, which may be referred to as imaging systems, use one or more exposure sources, including solid state emitter devices, for operations including patterning photoresists. Signal classifiers are used to perform shape and pattern recognition to determine whether signals received during substrate scanning are from a top photoresist surface or from sub-surface layers. One or more parameters of the imaging apparatus can be adjusted or maintained based on the signal analysis.

Various features of display-sized glass substrates, such as substrate composition and size, make maintaining focus during patterning difficult as compared to maintaining focus while patterning substrates containing only silicon. For example, display substrates can have dimensions of 1500 mm×1850 mm or larger, and can have a highly non-uniform thickness across the substrate. The thickness and the non-uniformity of the thickness across the substrate can be further varied as layers are formed and patterned. The non-uniformity is not able to be removed (smoothed) using chemical mechanical polishing (CMP). Further, digital photolithography systems have tight tolerances, for example, ±3 microns, for focus error due to the small depth-of-focus lenses used for sub-micron printing resolution. The digital photolithography systems tolerance is therefore less than the variation in uniformity across a substrate, which can vary by ±10 microns or more.

The systems and methods discussed herein are directed towards real-time autofocusing of imaging apparatuses during substrate patterning. The initial position of a substrate in an imaging apparatus can be adjusted or maintained to autofocus the imaging system during substrate patterning. Autofocusing reduces or eliminates the occurrence of autofocus-related mura. Classifiers include one or more shape descriptors associated with a value or a range of values. One or more classifiers are applied to input signals as discussed herein to determine a substrate composition associated with a substrate location based on an input signal.

The systems and methods discussed herein thus improve autofocusing of imaging apparatuses, especially when the substrates positioned in the imaging apparatuses are multi-layer, multi-material substrates with a photoresist formed over patterns of various reflective and non-reflective materials. When the imaging system projects laser beams on to the substrate, the resultant signals can differ based upon whether the laser beams are contacting the photoresist or the photoresist with one or more underlying, different materials. The imaging apparatuses are configured to execute imaging programs that include predetermined initial exposure positions for the substrate. As discussed herein, an "exposure position" is a distance between (i.e., separating) a stage in an imaging apparatus and an exposure source of the imaging apparatus, and the stage is a component of an imaging system that is configured to secure a substrate during digital photolithography.

The initial exposure position can be adjusted during scanning but adjusting the initial position in response to signals received from mixed-material areas of the substrate can cause out-of-focus exposures using conventional methods. The loss of focus during scanning can result from positional adjustments that are based on reflections from metallic materials or other materials because those reflections (i.e., noise) do not reflect the relative position of the substrate surface to the exposure source. In contrast, in the examples discussed herein, the imaging apparatus is configured to determine (1) whether the composition of the underlying substrate falls into an identified class of substrate composition, and (2) whether the initial position is to be adjusted based on the identified class. The imaging apparatus can be further configured to determine (3) how the initial position is to be adjusted to a second position (e.g., an amount of movement and/or a direction(s) of movement). Thus, adjustments to the initial position can be made based upon a determination of a substrate composition class associated with a substrate location on the top of the photoresist and not based upon reflection noise from layers underneath the substrate surface of the photoresist.

The systems and methods discussed herein are directed towards autofocusing an imaging apparatus during patterning of a substrate. In particular, the systems and methods discussed herein relate to locating a top surface of a photoresist disposed over a substrate. The top surface is located and used to adjust or maintain an exposure position of the imaging apparatus to avoid making erroneous adjustments based on reflections from materials underneath the photoresist. The substrate can include materials underneath the photoresist including glass or other transparent or optically transparent materials, dielectric material(s), uniform or non-uniform metallic materials, or other materials referred to herein as subsurface materials or subsurface features.

FIG. 1A is a perspective view of a photolithography system 100A according to embodiments disclosed herein. The photolithography system 100A can alternatively be referred to as an imaging apparatus, and includes a base frame 110, a slab 120, a stage 130, and a processing apparatus 160. The base frame 110 rests on the floor of a fabrication facility and supports the slab 120. A plurality of passive air isolators 112 are positioned between the base frame 110 and the slab 120. In one embodiment, the slab 120 is a monolithic piece of granite, and the stage 130 is disposed on the slab 120. A substrate 140 is supported by the stage 130. A plurality of holes (not shown) are formed in the stage 130 for allowing a plurality of lift pins (not shown) to extend therethrough. In some embodiments, the lift pins rise to an extended position to receive the substrate 140, such as from one or more transfer robots (not shown). The one or more transfer robots are used to load and unload a substrate 140 from the stage 130.

The substrate 140 includes any suitable material, for example, quartz, is used as part of a flat panel display. In other embodiments, the substrate 140 is made of other materials capable of being used as a part of the flat panel display. In some embodiments, the substrate 140 has a photoresist layer formed thereon which is sensitive to radiation. A positive photoresist includes portions of the photoresist, which, when exposed to radiation, are respectively soluble to a photoresist developer applied to the photoresist after the pattern is written into the photoresist. A negative photoresist includes portions of the photoresist, which, when exposed to radiation, will be respectively insoluble to photoresist developer applied to the photoresist after the pattern is written into the photoresist. The chemical composition of the photoresist determines whether the photoresist will be a positive photoresist or negative photoresist. Examples of photoresists include, but are not limited to, at least one of diazonaphthoquinone, a phenol formaldehyde resin, poly (methyl methacrylate), poly(methyl glutarimide), and SU-8. In this manner, the pattern is created on a surface of the substrate 140 to form the electronic circuitry.

The photolithography system 100A includes a pair of supports 122 and a pair of tracks 124. The pair of supports 122 are disposed on the slab 120, and in one embodiment, the slab 120 and the pair of supports 122 are a single piece of material. The pair of tracks 124 are supported by the pair of the supports 122, and the stage 130 moves along the tracks 124 in the X-direction as indicated by the coordinate system shown in FIG. 1A. In one embodiment, the pair of tracks 124 is a pair of parallel magnetic channels. As shown, each track 124 of the pair of tracks 124 is linear. In other embodiments, one or more track 124 is non-linear. An encoder 126 is coupled to the stage 130, the encoder 126 is configured to provide location information to a controller 190.

In an embodiment, the processing apparatus 160 includes a support 162 and a processing unit 164. The support 162 is disposed on the slab 120 and includes an opening 166 for the stage 130 to pass under the processing unit 164. The processing unit 164 is supported by the support 162. In one embodiment, the processing unit 164 is a pattern generator configured to expose a photoresist in a photolithography process. In some embodiments, the pattern generator is configured to perform a maskless lithography process. The processing unit 164 includes a plurality of image projection apparatuses (shown in FIGS. 2A and 2B). In one embodiment, the processing unit 164 contains as many as 84 image projection apparatuses. Each image projection apparatus is disposed in a case 165. The processing apparatus 160 is useful to perform maskless direct patterning.

The controller 190 facilitates the control and automation of the processing techniques described herein, including execution of one or more imaging programs. The controller 190 is coupled to or in communication with one or more of the processing apparatus 160, the one or more stages 130, and the encoder 126. The processing apparatus 160 and the one or more stages 130 provide information to the controller regarding the substrate processing and alignment. For example, the processing apparatus 160 provides information to the controller 190 to alert the controller 190 that substrate processing is complete. Substrate scanning can be completed in a matter of milliseconds (ms), for example, from 5 ms to 30 ms. In another example, the controller 190 is configured to execute a plurality of instructions to determine when to adjust an exposure position of the imaging apparatus in real-time by scanning the substrate pixel-by-pixel to autofocus the exposure source during exposure (patterning) of the substrate. In one example, the controller 190 adjusts the one or more stages 130 to an initial position when a substrate is positioned on or in the one or more stages. In still another example, the controller 190 is configured to execute a plurality of instructions to determine a velocity of the exposure scanning and an exposure position for the imaging apparatus in real-time by scanning the substrate pixel-by-pixel to autofocus the exposure source during exposure (patterning) of the substrate.

The controller 190 includes a central processing unit (CPU) 192, memory 194, and support circuits (or I/O) 196. The CPU 192 is one of any form of computer processors used in industrial settings for controlling various processes and hardware (e.g., pattern generators, motors, and other hardware) and/or monitoring the processes (e.g., processing time and substrate position). The memory 194 is connected to the CPU 192. The memory 194 is one or more of a readily available memory, such as random access memory (RAM), read only memory (ROM), floppy disk, hard disk, or any other form of digital storage, local or remote. Software instructions and data are coded and stored within the memory 194 for instructing the CPU 192. The support circuits 196 are also connected to the CPU for supporting the processor in a conventional manner. The support circuits include conventional cache, power supplies, clock circuits, input/output circuitry, subsystems, and the like. A program (or computer instructions), which may be referred to as an imaging program, is readable by the controller determines which tasks are performable on a substrate. The program is software readable by the controller and includes code to monitor and control, for example, the processing time and substrate position.

During operation, the stage 130 moves in the X-direction at a predetermined velocity from a loading (first) position, as shown in FIG. 1A, to a processing (second) position. The processing position is one or more positions of the stage 130 as the stage 130 passes under the processing unit 164. During operation, the stage 130 is be lifted by a plurality of air bearings (not shown) and the stage 130 moves while lifted along the pair of tracks 124 from the loading position to the processing position. A plurality of vertical guide air bearings (not shown) are coupled to the stage 130 and positioned adjacent an inner wall 128 of each support 122 in order to stabilize the movement of the stage 130. The stage 130 also moves in the Y-direction by moving along a track 150 for processing and/or indexing the substrate 140. The stage 130 is capable of independent operation and can scan a substrate 140 in one direction and step in the other direction.

A metrology system (not shown) measures the X and Y lateral position coordinates of each of the stage 130 in real-time so that each of the plurality of image projection apparatuses can accurately locate the patterns being written in a substrate 140 that is covered in a photoresist. The metrology system also provides a real-time measurement of an angular position of the stage 130 about the vertical or Z-axis. The angular position measurement may be used to hold the angular position of the stage 130 constant during scanning by means of a servo mechanism (not shown). In another example, the angular position measurement may be used to apply corrections to the positions of the patterns being written on the substrate 140 by the image projection apparatus 200A and 200B, shown in FIGS. 2A-2B and discussed below. In some examples, these techniques may be used in combination.

Figure 1B:
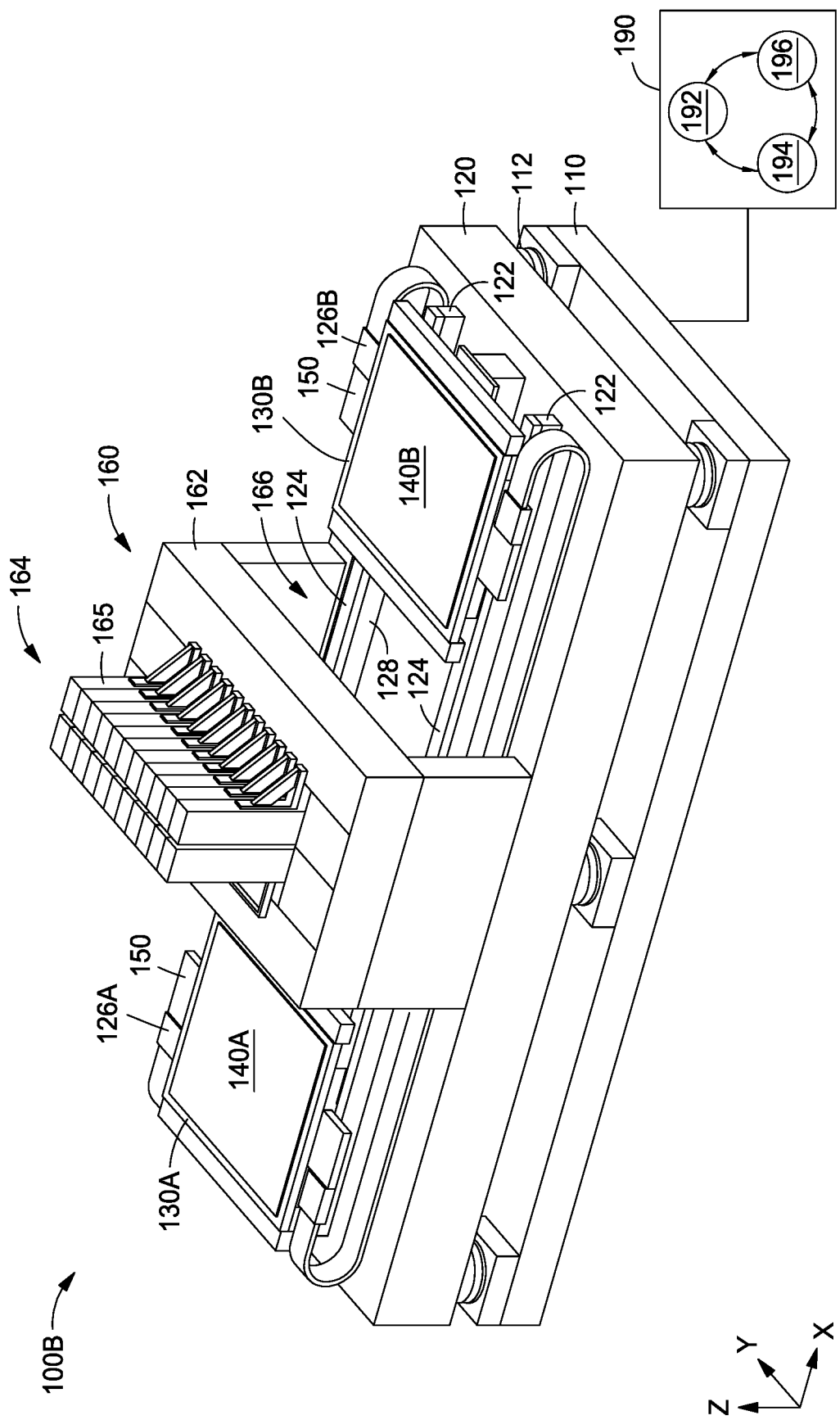
FIG. 1B is a perspective view of an alternate photolithography system according to embodiments of the present disclosure.

FIG. 1B is a perspective view of a photolithography system 100B according to embodiments disclosed herein. The photolithography system 100B is similar to the photolithography system 100A; however, the photolithography system 100B includes a first stage 130A and a second stage 130B. Each of the two stages 130A and 130B is capable of independent operation such that the system can scan a substrate 140A or 140B in a first direction and step in a second, other direction. In some embodiments, when one of the two stages 130A or 130B is scanning a substrate 140, the other of the two stages 130A or 130B is unloading an exposed substrate and loading the next substrate to be exposed. In one example, the first stage 130A scans the substrate 140A, and the second stage 130B unloads an exposed substrate 140B and loads the next substrate (not shown) to be exposed. Also shown in FIG. 1B are the first and second encoders 126A and 126B, respectively co-located with stages 130A and 130B.

While FIGS. 1A-1B each depict an embodiment of a photolithography system (100A and 100B, respectively), other systems and configurations are also contemplated herein. For example, photolithography systems including any suitable number of stages (e.g., 3 or more of the stage(s) 130) are also contemplated.

Figure 2A:
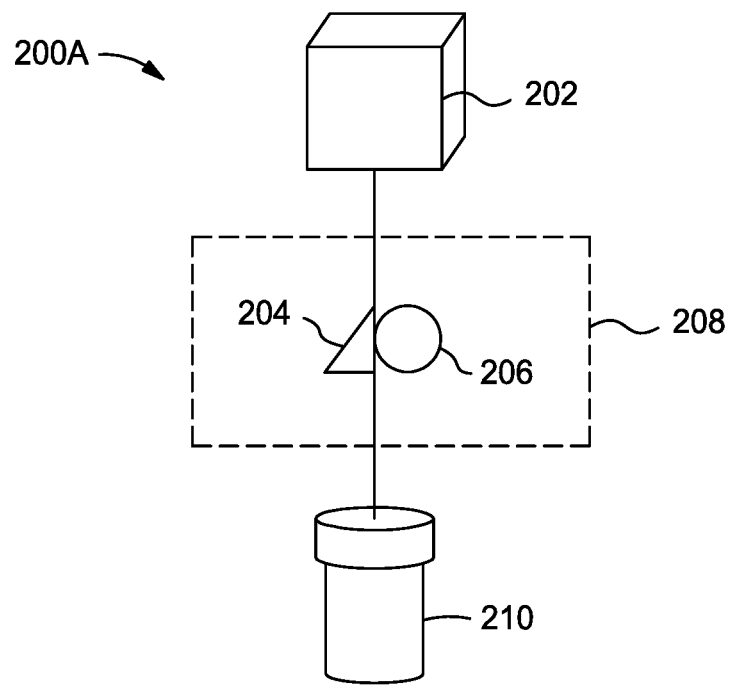
FIG. 2A is a perspective schematic view of an image projection apparatus according to embodiments of the present disclosure.
Figure 2B:
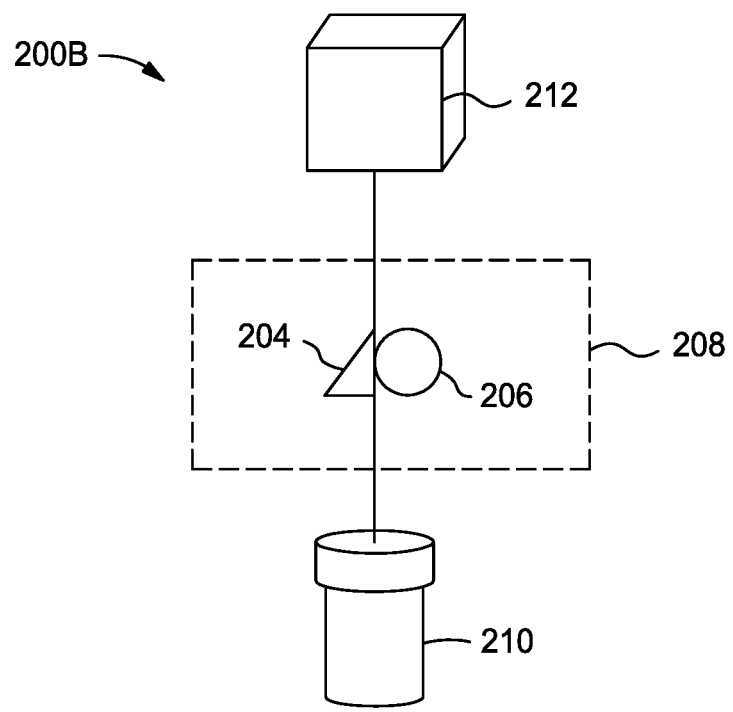
FIG. 2B is an image projection apparatus according to embodiments of the present disclosure.

FIG. 2A is a perspective schematic view of an image projection apparatus 200A according to one embodiment. FIG. 2B is an image projection apparatus 200B according to another embodiments. The image projection apparatuses 200A and 200B may be useful for a photolithography system, such as photolithography systems 100A or 100B in FIGS. 1A and 1B.

In FIG. 2A, the image projection apparatus 200A includes one or more spatial light modulators 202, an alignment and inspection system 208 including a focus sensor 204 and a camera 206, and a plurality of projection optics 210. In some examples, the image projection apparatus 200A can be referred to as a "channel." The components of the image projection apparatus 200A may vary depending on a type of spatial light modulator 202 being used. Spatial light modulators 202 include, but are not limited to, solid state emitters, digital micromirror devices (DMDs), vertical-cavity surface-emitting lasers (VCSELs), among others. Solid state emitters emit electromagnetic radiation and are microscopic, for example, less than about 100 μm at the largest dimension. In some examples, light emitting diodes such as microLEDs may be employed.

Various examples of solid state emitter devices can be arranged in arrays in an exposure source of an imaging system used for digital photolithography. Each solid state emitter may be associated with at least one pixel of the display. In some embodiments, a plurality of sub-pixels may be associated with each pixel. The solid state emitters discussed herein emit electromagnetic radiation and may be used in light-emitting devices (LEDs), uLEDs, vertical-cavity surface-emitting lasers (VCSEL), and other devices. Various voltages may be used, depending upon the type of solid state emitter used. In examples where a uLED is employed, a voltage applied may be from 100 mV to 7 V.

In operation, the spatial light modulator 202 is used to emit light and/or modulate one or more properties of the light, such as an amplitude, a phase, or a polarization of the light, which is projected through the image projection apparatus 200A to a substrate, such as the substrate 140 in FIG. 1A. The alignment and inspection system 208 is used for alignment and inspection of the components of the image projection apparatus 200A and/or 200B. In one embodiment, the focus sensor 204 includes a plurality of lasers that are directed through the lens of the camera 206, and signals are then transmitted back through the lens of the camera 206 and imaged onto sensors to detect whether the image projection apparatus 200A is in focus. The camera 206 is used to image the substrate, such as substrate 140, including to ensure the alignment of the image projection apparatus 200A and photolithography system 100A or 100B is correct or within an predetermined tolerance. The projection optics 210, such as one or more lenses, are used to project the light, either modulated or unmodulated, onto the substrate.

In the embodiment shown in FIG. 2B, the image projection apparatus 200B, which can also be referred to as a "channel," similarly to the image projection apparatus 200A, includes a device 212, such as a solid state emitter device, as the spatial light modulator(s), an inspection system 208 comprising a focus sensor 204 and a camera 206, and projection optics 210. The device 212 may comprise a plurality of solid state emitters. Since solid state emitters are self-emitting, an outside light source need not be included in the image projection apparatus 200B. In one embodiment, the image projection apparatus 200B further includes a beamsplitter (not shown). The autofocusing discussed herein employs the image projection apparatuses of FIGS. 2A and 2B and utilizes the signal data collected to autofocus the projection optics 210 during patterning the substrate to avoid the formation of mura.

Figure 3:
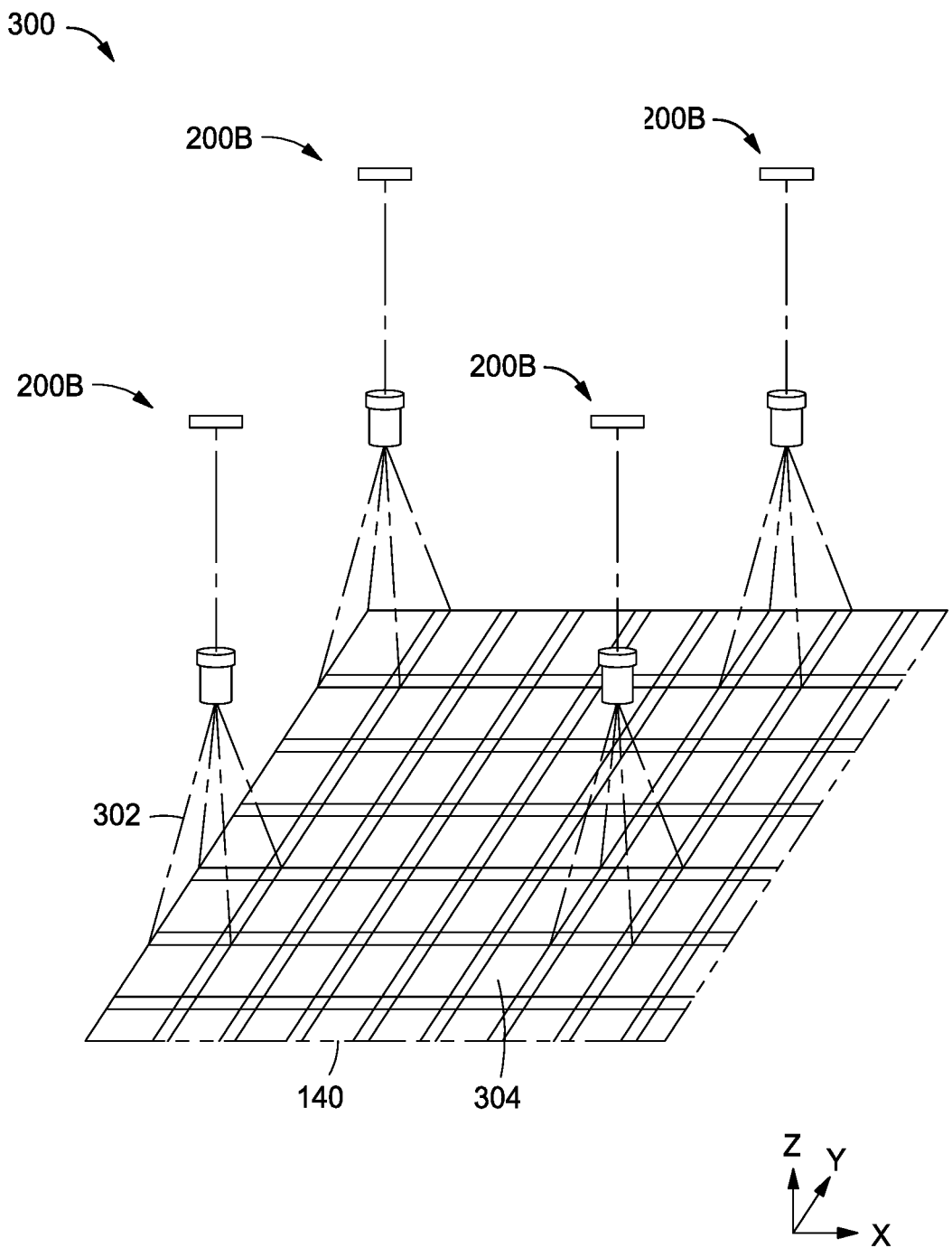
FIG. 3 illustrates a schematic view of a plurality of image projection apparatuses according to embodiments of the present disclosure.

FIG. 3 illustrates a schematic view of a system 300 comprising a plurality of image projection apparatuses 200B of FIG. 2B. It is to be understood that while image projection apparatus 200B are shown, it is contemplated that image projection apparatus 200A of FIG. 2A may be used either in place of or in addition to the image projection apparatus 200B. The plurality of image projection apparatuses 200B may be used in a photolithography system, such as photolithography systems 100A and 100B. In operation, each image projection apparatus 200B produces or projects a plurality of write beams 302 onto a surface 304 of the substrate 140. As the substrate 140 moves in the X-direction and/or the Y-direction, as indicated by the coordinate system in FIG. 3, the entire surface 304 across the substrate 140 from edge to edge is patterned by the write beams 302. In various embodiments, the number of image projection apparatuses 200B included in the system varies based on factors such as the size of the substrate 140 and/or the speed of the one or more stages 130 (shown in FIGS. 1A and 1B). Thus, while four image projection apparatuses 200B are shown, the system 300 may include additional or fewer image projection apparatuses 200B.

Figure 4:
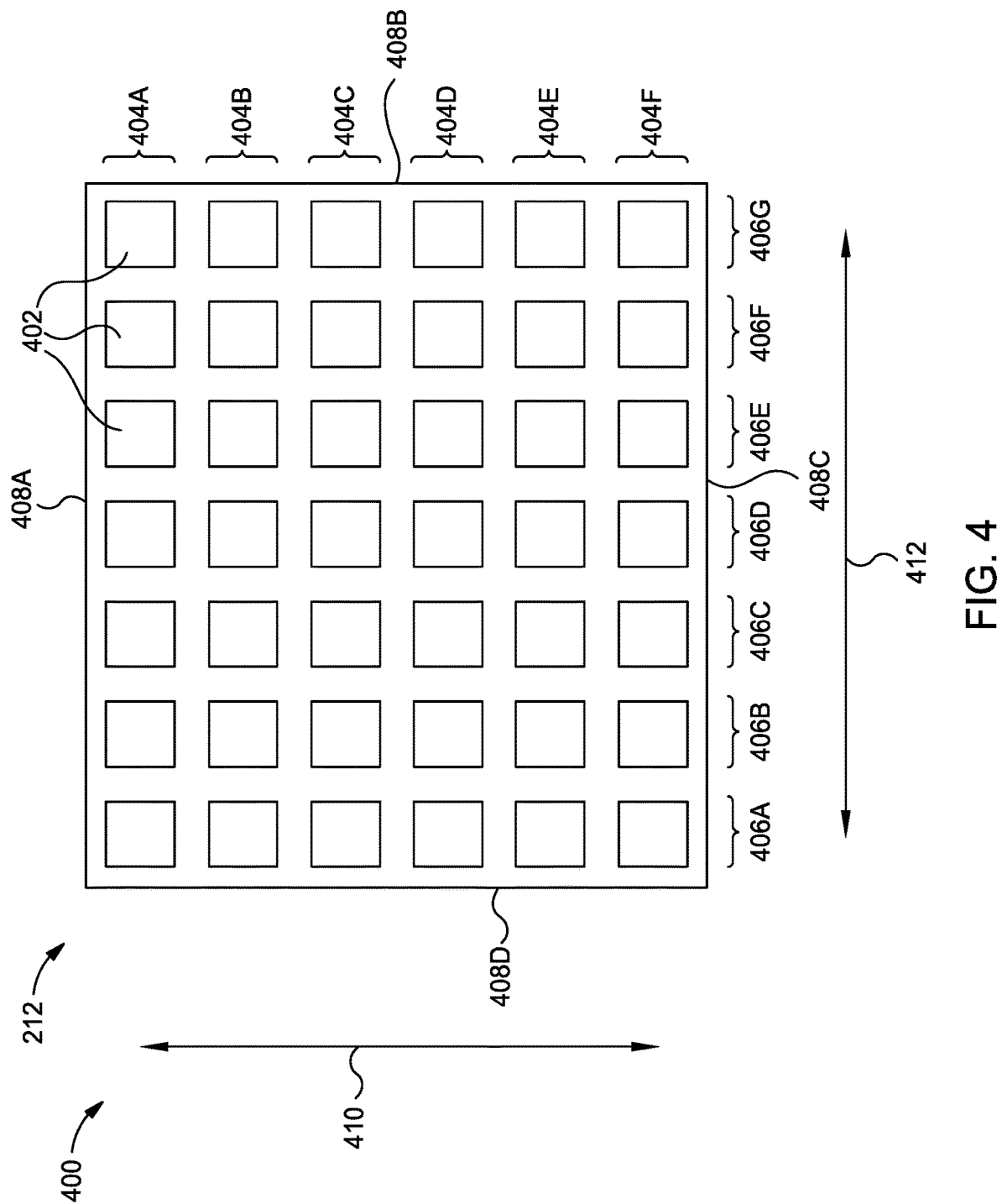
FIG. 4 is a partial schematic illustration of a solid state emitter device according to embodiments of the present disclosure.

FIG. 4 illustrates an exemplary imaging apparatus system 400 comprising at least one device 212, according to another embodiment. The device 212 may be a solid state emitter device, like described in FIG. 2B. As shown in FIG. 4, the device 212 includes a plurality of solid state emitters 402 disposed in an array. Since solid state emitters 402 are self-emitting, an outside light source is not included in the image projection apparatus 200B. Additionally, unlike DMD micromirrors which are configurable between an "on" and "off" state, each solid state emitter 402 has a variable intensity which enables an enhanced grayscale controllability. The device 212 may be defined in part by four sides, which may be referred to as "edges" herein. The edge is a physical boundary of the substrate and device 212, and each device 212 may be defined in part by a first edge 408A, a second edge 408B, a third edge 408C, and a fourth edge 408D.

In some examples, the first edge 408A may be referred to as a "north" edge, the second edge 408B may be referred to as an "east" edge, the third edge 408C may be referred to as a "south" edge, and the fourth edge 408D may be referred to as a "west" edge. Thus, references to the "north-south" adjustability or directionality references a direction 410 from the first edge 408A to the third edge 408C (and from the third edge 408C to the first edge 408A), and references to "east-west" adjustability of directionality references a direction 412 from the second edge 408B to the fourth edge 408D (and from the fourth edge 408D to the second edge 408B).

The east-west adjustability discussed herein refers to the tunability of a voltage that is applied to the device 212 as well as the tunability of a gate bias, which may be set to 0 or to greater than 0. In one example, as substrate moves from the fourth edge 408D to the second edge 408B, and both the substrate and device 212 are substantially the same shape if not the same size, a plurality of "stripes" are formed when the voltage is received by some of the emitters 402 from the device 212. In some examples, the substrate is larger than the device 212 and a plurality of passes of the device 212 are made over the substrate.

The solid state emitters 402 are arranged in an array that includes a plurality of rows 404A-404F (collectively referred to as rows 404) and a plurality of columns 406A-406G (collectively referred to as columns 406). While six rows 404 and seven columns 406 are shown in FIG. 4 as an example, a device 212 can include millions of solid state emitters 402. As such, the emitters 402 may be disposed in any reasonable number of rows 404 and columns 406.

Each of the solid state emitters 402 corresponds to a pixel in a display. For example, one embodiment of a solid state emitter device 402 has a size of 1024 by 2048 pixels. Various pulses can be applied to the plurality of rows 404 and/or columns 406, to individual solid state emitters 402, and/or to groups of solid state emitters 402 other than the rows 404 and columns 406 discussed herein. The application of pulses to the device 212 across various regions of a substrate in either direction 410 and/or direction 412 thereby forms a plurality of patterned features on the substrate of a desired or target feature size.

The imaging apparatus system 400 uses shape and pattern recognition of signals from reflections of lasers aimed at the substrate. The signals discussed herein are the intensity distribution of the laser beam spot reflected off the surface on which the system 400 is trying to maintain focus during scanning. The determination as to whether or not a signal is received from a top surface of the substrate promotes in-focus exposures by avoiding erroneous adjustments due to reflections from sub-surface features on the substrate.

One or more classifiers can be used to determine if a signal received from the substrate, before or after transformation of the signal, is associated with a class of substrate composition within a plurality of classes of substrate composition. Each class of substrate composition of the plurality of classes of substrate composition is associated with a composition of the substrate. Each classifier can be associated with a specific class of substrate composition. Each classifier can include one or more shape descriptors and a specification that links the one or more shape descriptors to one or more values or tolerances of values. The signals discussed herein can include one or more peaks or humps. A peak is a signal feature that can be analyzed to determine a location of the laser that is used. A hump is another type of signal feature that may not be as pronounced as a peak and that can be transformed prior to analysis.

The classifiers and/or shape descriptors can be used to determine if the exposure source is over a portion of the substrate that includes only a photoresist (e.g., the top surface of the substrate) or over a portion that is a combination of materials, such as metallic materials underneath the substrate. The shape descriptors can include curve features such as amplitude, width, a height that can be less than the amplitude and/or determined based on the width, symmetry along the y-axis, fill ratio, an area under the curve, skewness, or other measurable features of the curves (e.g., the peaks and/or humps). The shape descriptors can further include a distance from the start of the signal to the peak and/or a convexity of the peak. In one example, an imaging program executed to pattern a substrate includes a plurality of specifications, one of which being a peak width. The peak width can be used to form a box from which a height of the peak is taken, as opposed to the amplitude of the peak which is the maximum height of the peak from the baseline to the peak. Thus, once a signal is reflected off of a location on the substrate and received by a sensor, the curves, peaks, and/or humps of the signal are analyzed using the classifiers and/or shape descriptors to determine or estimate which class of the plurality of classes of substrate composition the signal belongs in.

The plurality of classes of substrate composition can be stored in a non-transitory memory of the imaging apparatus or on a remote server that is communicatively coupled to the imaging apparatus. The plurality of classes can include a first class of substrate composition where the composition of the substrate is a photoresist formed over glass, and a second class (i.e., a reflective metallic class) associated with substrate locations where a photoresist is formed over a uniform reflective metallic material. The plurality of classes can further include a third class of substrate composition that is associated with locations on the substrate where the substrate composition includes a photoresist formed over a different material or topography that does not distort or interfere with the signal. A fourth class of substrate composition is associated with locations on the substrate where the substrate composition includes a photoresist formed over a different material or topography that interferes with the signal.

Each class may be associated with different or unique signals, classifiers, and/or shape descriptors. For example, signals received from the second and fourth classes are more distorted than signals received from the first and third classes, and signals received from the first class may be less distorted or have a more symmetrical shape than signals received from the third class. Distorted signals may comprise unpredictable peaks and/or severe asymmetry. Thus, once the signal reflected off a location on the substrate is received by a sensor and analyzed using the classifiers and/or shape descriptors, the class of substrate composition can be determined or estimated.

When a signal is determined to have been received from a location, for example when the signal is received from the top surface of the substrate based on an identified class of substrate composition, a subsequent determination can be made regarding adjustments of the imaging apparatus. If it is determined that the signal received is from a location on the substrate other than the top surface (i.e., photoresist), e.g., that the signal is associated with a class of substrate that includes reflections of sub-layers, the system can continue scanning without adjustment. The imaging program indicates that the position of the substrate/stage relative to the exposure source as indicated by the signal analyzed is either within a predetermined distance between the substrate/stage and exposure source stored in the imaging program, in which case no adjustments are needed, or outside the predetermined distance between the substrate/stage and exposure source stored in the imaging program, in which case adjustments may be made in real-time, as discussed further below.

The autofocusing discussed herein is achieved by positioning the exposure source in an exposure position relative to a substrate. An initial exposure position is determined based on an imaging program and can be adjusted in real-time during substrate scanning. The systems and methods discussed herein are used for autofocusing and include running a routine on a location on a substrate for data received by a sensor, and then re-running the same routine (e.g., the substrate height analysis discussed herein) on multiple locations across the substrate in real-time. In one example, the substrate includes a plurality of pixels, and the routine is run on each pixel in real time during scanning. A position of the substrate relative to the position of the exposure source is determined using imaging data.

A plurality of imaging programs is stored in a non-transitory memory and are executable by a processor to cause a controller of the imaging apparatus to execute a plurality of instructions to pattern a substrate. The plurality of imaging programs can be stored locally in a non-transitory memory of the imaging apparatus or in a remote location that is directly or indirectly communicatively coupled to the imaging apparatus. The plurality of instructions can be selected/loaded based on one or more aspects of a substrate, including: a photoresist type, an average photoresist thickness, a maximum photoresist thickness, a composition of material(s) underlying the photoresist, a thickness of the material(s) underlying the photoresist, and/or a part number associated with an intermediate or a final product that includes the substrate. Each imaging program can include a plurality of operational settings such as scanning rate or velocity, scanning direction, initial exposure position, a distance range for the exposure position, scanning time, exposure intensity, and other operational parameter settings.

In one example, an imaging program can be configured to evaluate a signal against a single classifier associated with a single class of substrate composition. In another example, an imaging program can be configured to evaluate a signal against more than one classifier, each classifier being associated with at least one class of substrate composition. The imaging program can include an order of two or more classifiers to be used to determine if the signal is associated with a predefined class of substrate composition. The order can further indicate a number, a type, or another means by which a signal is evaluated against one or more classes of substrate composition that each include one or more classifiers and/or shape descriptors within each classifier that are evaluated and/or weighted. When the substrate is positioned in the imaging apparatus, an imaging program is selected, loaded, and executed that includes a scanning rate, a scanning time, a distance range for the exposure position, and an initial exposure position.

The autofocus input data used herein is provided via a plurality of linear imaging sensors, such as complementary metal oxide semiconductor (CMOS) sensors, disposed in the imaging apparatus. The sensors are coupled to the imaging apparatus to capture the reflection of the focus lasers off the substrate surface. The imaging apparatus scans the substrate during patterning and can adjust the height of the exposure source relative to the substrate during scanning. On non-patterned metal or glass plates, a CMOS sensors will capture a single Gaussian-like peak associated with the substrate reflection, where the location of the peak indicates the distance of the surface to the sensor. The signal peaks discussed herein can be convex-shaped triangles or bell shapes.

Over a patterned substrate, however, such as a patterned substrate including metallic material and a photoresist, metal reflections distort the photoresist reflections in various undesirable ways, which negatively impacts the ability of the system to focus, let alone allow for real-time autofocusing. This can produce signals with a plurality of peaks and/or humps, where the peaks may not be defined sufficiently to analyze without transformation. In one example, a substrate has a photoresist disposed over a pattern including metallic material or other materials. Such a pattern can take various forms and shapes of interconnecting geometries such that there can be portions of the substrate that include only the photoresist and portions of the substrate where a laser beam contacts the substrate on the edges or corners of features underlying the substrate.

When an exposure or exposures are performed out of focus on a substrate, an undesirable visual phenomenon called mura occurs. Mura amplifies the microscopic effects of slight focus deviations, leading to defective displays. This challenge is amplified for display substrates with varying compositions, such as when the substrate includes a photoresist as well as metallic material. Therefore, as substrates increase in size and vary in composition, and have sub-surface features that can be formed from materials of various optical properties including metallic and/or dielectric materials, it becomes harder to autofocus the imaging system. The sub-surface features can be of complex geometries and can be multi-layered. The complex geometries can lead to features that are both larger and smaller than the laser beams, and, in some examples, geometries may cause some locations of the substrate to have gaps in between patterned features. The reflection from sub-surface features can distort the signals received from the laser, which can cause unnecessary adjustments in processing parameters, including the exposure position discussed below, and can further lead to the formation of mura.

The autofocusing discussed herein allows for the continual adjustment of an imaging system during scanning while patterning the substrate. The imaging system may be a system such as a digital lithography system that is used to produce an optimal, focused, exposure for the substrate during one or more exposures during a patterning process. The imaging apparatus includes a plurality of channels, and each channel includes a laser beam and a sensor, such as CMOS sensors. The autofocus inputs are multi-dimensional, including x-coordinates, y-coordinates, and z-coordinates, over the substrates, the exposure source position, the linear sensor pixel position, a scanning velocity, and a light intensity. As discussed herein, a stage(s) on which a substrate is disposed in the imaging system and/or the exposure source can be moved in the x-direction, the y-direction, or the z-direction during the autofocusing operation.

Figure 5B:
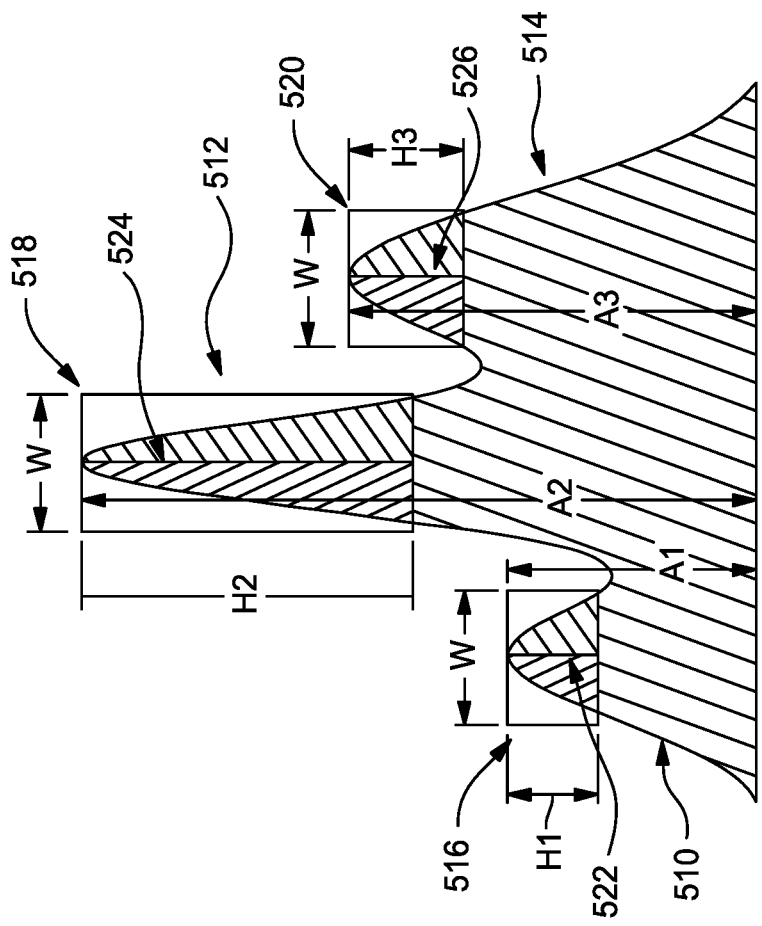
FIGS. 5A and 5B illustrate example signals and shape descriptors according to embodiments of the present disclosure.
Figure 5A:
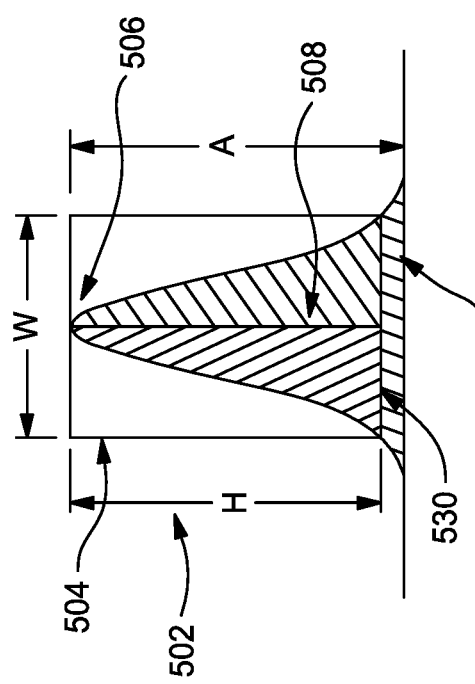

FIGS. 5A and 5B are examples of signals and shape descriptors that can be included in classifiers in imaging programs. The signals of FIGS. 5A-5B may be obtained utilizing the imaging apparatus system 400 of FIG. 4. The classifiers are used to determine the composition of a substrate location and include one or more shape descriptors that are applied in series or in parallel to a signal. FIG. 5A illustrates a signal 502 and a box 504 that can be defined by a width (W). The signal 502 is an example of a curve or signal received by one of the sensors, such as the CMOS sensors discussed above. The width (W) of the signal 502 can be determined based upon the imaging program executed by the imaging apparatus. After being determined, the width can be used as the base of the box 504. The box 504 is used to further analyze shape descriptors of the signal 502. Each imaging program can include a different width to use during the evaluation of one or more classifiers against one or more signals.

A height (H) of the signal 502 is the distance from the peak 506 of the signal 502 to the bottom 530 of the box 504. The amplitude (A) can be defined by a distance from the peak 506 of the signal 502 to a base 528 of the signal 502. The symmetry of the signal 502 is shown by symmetry line 508 and is an indication of the similarity in shape and size of the areas of the curve within the box 504 located on either side of the symmetry line 508. An area (Ar) under the curve (signal 502) is the portion of the signal 502 within the box 504, the box 504 being defined by the height (H) and the width (W). A fill ratio (F) of the signal 502 can be calculated by a ratio of the area (Ar) of the signal 502 to an area Ab of the box 504. Equation (1) can be used to calculate an area Ab of a box such as the box 504, and equation (2) can be used to calculate the fill ratio (F).

$$A_b = W \times H \quad (1)$$

$$F = A_r/A_b. \quad (2)$$

In an embodiment, when instructions are executed by a controller (e.g., the controller 190 of FIG. 1A), the width is defined by the instructions, such as the imaging program, and a first peak can be determined by analyzing the first peak from a first side to a second side, for example, from left to right, to find the first peak. In embodiments where a signal is a multi-peak signal, like shown in FIG. 5B, a plurality of peaks can be analyzed in series or in parallel from the first side to the second side. For example, the first peak of a signal is analyzed to determine the substrate composition, as the first peak corresponds to the top surface of the substrate, whereas peaks to the right of the first peak can be associated with sub-layers underneath the top surface.

FIG. 5B illustrates a plurality of signals including a first signal 510, a second signal 512, and a third signal 514. In the example in FIG. 5B, each of the first signal 510, the second signal 512, and the third signal 514 is defined by the same width (W). The W value is located on each of the first signal 510, the second signal 512, and the third signal 514. The value of the width is used to form a first box 516 around the first signal 510, a second box 518 around the second signal 512, and a third box 520 around the third signal 514. The first box 516 is defined by the width and a first height H1, the second box 518 is defined by the width and a second height H2, and the third box 520 is defined by the width and a third height H3. Each of the first height H1, the second height H2, and the third height H3 are different, thus the area (Arx) of the curve of each box 516, 518, 250 (x) is different. The first signal 510 can be defined by an amplitude A1 and a first symmetry line 522, the second signal 512 is defined by an amplitude A2 and a second symmetry line 524, and the third signal 514 is defined by an amplitude A3 and a third symmetry line 526. In this example, A2>A3>A1; H1<H3<H2; Ar1<Ar3<Ar2; and the fill of the third signal 514 is greater than the respective fills of the first signal 510 and the second signal 512.

Figure 6A:
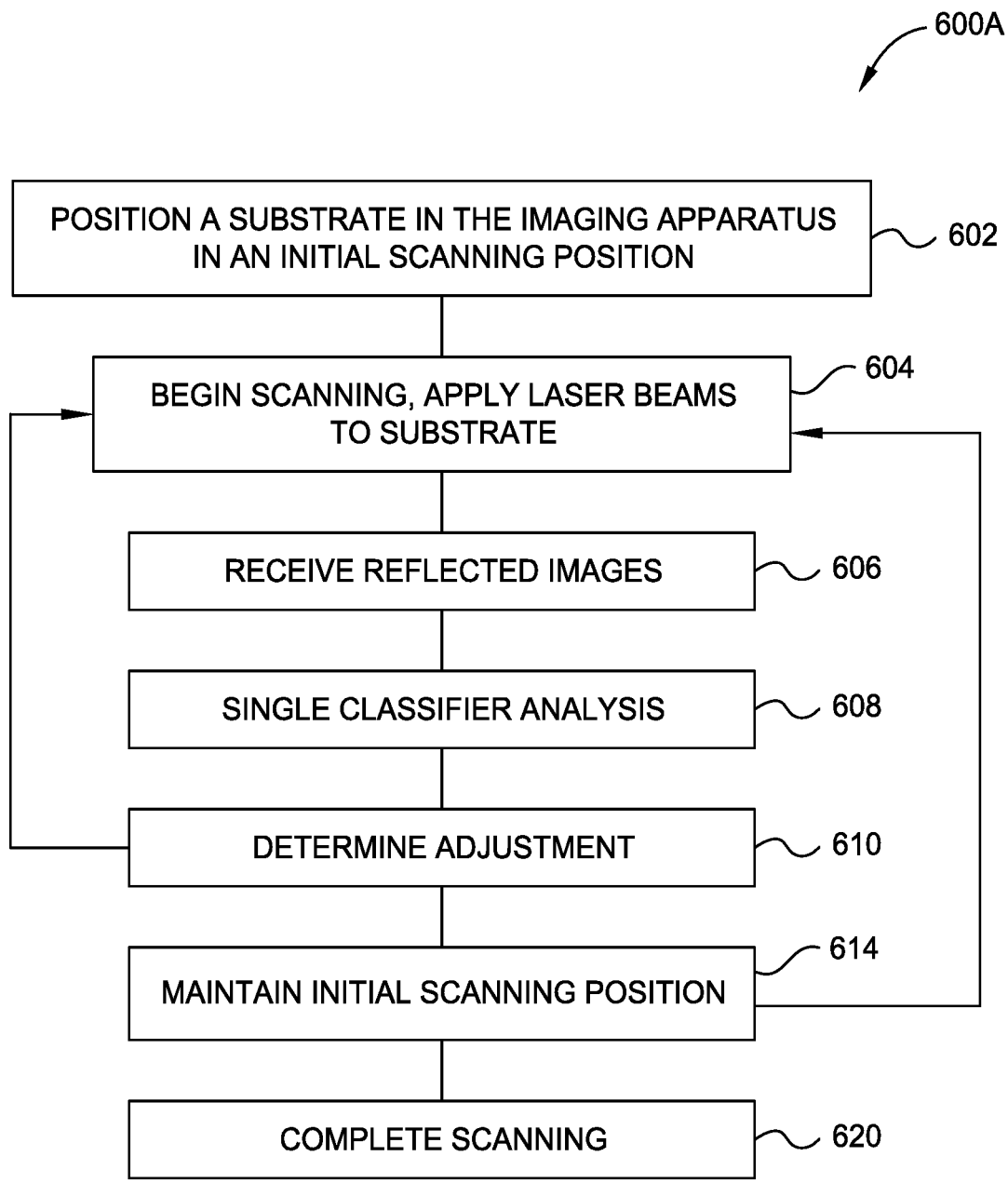
FIGS. 6A-6C are flowcharts of methods of autofocusing an imaging apparatus according to embodiments of the present disclosure.
Figure 6B:
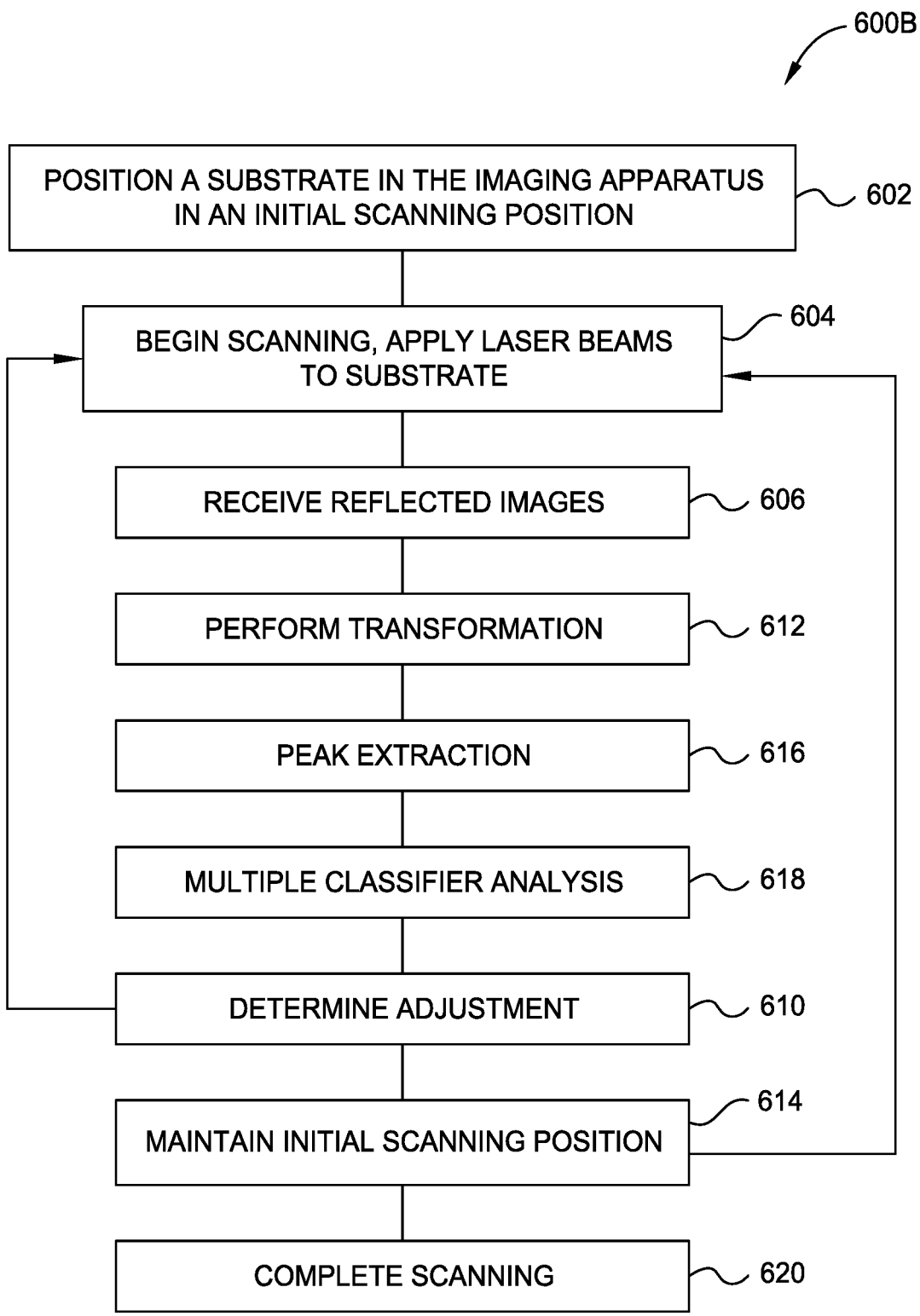
Figure 6C:
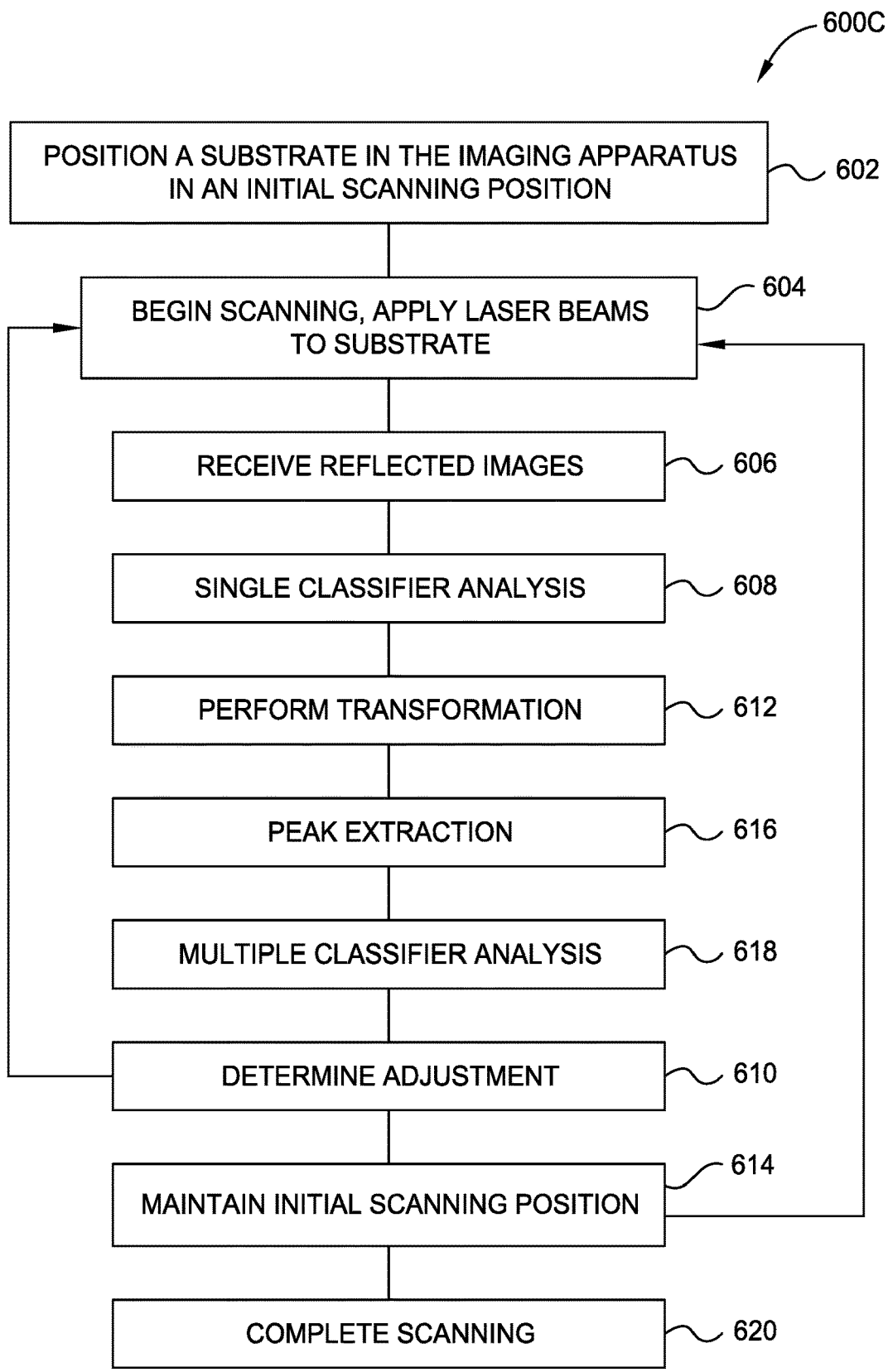

FIGS. 6A-6C are flowcharts of methods of autofocusing an imaging apparatus according to embodiments of the present disclosure. FIG. 6A is flowchart for a method 600A of autofocusing an imaging apparatus. In the method 600A, at operation 602, a substrate is positioned in an imaging apparatus, for example, the photolithography system 100A or 100B of FIGS. 1A and 1B. The substrate can be positioned on a stage of the imaging apparatus, and the stage can be adjusted to an initial position relative to the exposure source. The initial position of the substrate at operation 602 can be based on the execution of instructions associated with an imaging program by a controller such as the controller 190 discussed above. Further at operation 602, an initial scanning velocity and an initial scanning intensity are established, as well as other imaging parameters.

The imaging programs can be associated with one or more aspects of the substrate, including: a photoresist type, an average photoresist thickness, and a maximum photoresist thickness. The imaging programs can be further or additionally associated with a composition of material(s) underlying the photoresist, a thickness of the material(s) underlying the photoresist, and/or a part number associated with an intermediate or a final product that includes the substrate. Each imaging program includes instructions for scanning the substrate, such as a scanning velocity, initial position of the substrate relative to an exposure source, exposure time, exposure dose(s) intensity, total scanning time to scan the entire substrate, and other operational parameters of the imaging apparatus. Each imaging program can further include one or more classifiers used to determine a class of substrate composition. Each classifier can include specifications or values for shape descriptors of signals, as discussed in detail below. In some examples, imaging programs can additionally include a number, type, order of the shape descriptors, and/or classifiers to analyze (i.e., compare to the specification) to determine the substrate composition.

At operation 604, a substrate scanning process is initiated by the controller based on the imaging program, and a plurality of lasers is applied across the substrate to autofocus the imaging apparatus during patterning of the substrate. The plurality of lasers may be steep angle laser beams. The scanning is initiated at operation 604 when the substrate stage is in the initial position with respect to an exposure source, such as a microLED array or other solid state emitter array. The initial position can be adjusted during scanning based on the imaging program and/or based on the real-time analysis discussed below that occurs during the scanning initiated at operation 604. The lasers applied to the substrate during operation 604 are employed to determine if the reflected signal is coming from the top surface, which is a photoresist, or if the signal is coming from one or more subsurface layers that could distort the signal and lead to erroneous adjustments. Adjusting the imaging apparatus based upon a distorted signal can result in the mura discussed above.

At operation 606, a plurality of signals or reflections is received by sensors of the imaging apparatus, such as CMOS sensors. The signals can be received at various locations on each of the sensors. The plurality of signals received at operation 606 can be collectively referred to as an input signal. When the imaging apparatus is in focus, that is, when the imaging apparatus is configured to produce in-focus exposures, the intensity distribution of the input signals is a bell shape (i.e., a Gaussian distribution). Each laser is reflected from a location of the substrate that is either a photoresist or that is a photoresist disposed over a subsurface material that does not distort the signal. In some examples, at operation 606, signal conditioning can occur in order to improve the quality of the input signal to remove noise and improve the signal-to-noise ratio.

At operation 608, each of the plurality of signals is analyzed to determine if and what type of signal transformation is to be performed. Operation 608 can include extracting a first peak for analysis. A signal may be analyzed by applying one or more classifiers and/or shape descriptors to the signal. Analyzing the signal may comprise filtering out unusable data or signals (e.g., severely distorted signals). In one example, operation 608 is executed based on an imaging program including a single classifier that can be associated with a class of substrate composition that exhibits a Gaussian distribution or a symmetrical shape. A Gaussian distribution of the signal indicates that the location of the substrate scanned at operation 604 includes a photoresist or a photoresist formed over a material that does not cause the one or more shape descriptors associated with the single classifier to fall outside of a range or target value(s). Examples of shape descriptors are discussed above and shown in FIGS. 5A and 5B. The specifications can thus include a range, target, threshold, or other arrangements of values that can be used to evaluate one or more shape descriptors of a signal, including when those shape descriptors are part of a classifier. Depending upon the embodiment, the single classifier can include one or more specifications for shape descriptors that can be evaluated in series or in parallel.

In an example where two or more shape descriptors are evaluated in series during execution of the first classifier at operation 608, if it is determined at operation 608 that the first shape descriptor is within the specification included in the first classifier, a second shape descriptor of the first classifier is analyzed at operation 608. Furthermore, at operation 608, subsequent shape descriptors of the first classifier are similarly evaluated in series when a previously evaluated shape descriptor meets or does not meet the specification. In one example, each shape descriptor evaluated as a part of the first classifier is deemed to be within the specification, and the signal being evaluated can be associated with a class of substrate composition associated with the first classifier. In another example, the first shape detector of the first classifier can be the shape detector that takes the least amount of time to check, or it can be a shape detector that has previously shown to have the strongest correlation to determining the substrate composition.

In still another example where a single classifier is executed to determine a class of substrate composition, two or more shape descriptors can be evaluated simultaneously. Optionally, a second set of different shape descriptors may subsequently be analyzed. One classifier may comprise a first shape descriptor and a second shape descriptor, where the first shape descriptor and the second shape descriptor are associated with a different weighting. Determining if the signal is received from the top surface of the substrate is based on a sum of a first weighted value for the first shape descriptor based on a first weighting and a second weighted value for the second shape descriptor based on a second weighting. In some examples, one or more shape descriptors of the first classifier can be evaluated in parallel. If it is determined at operation 608 that the signal is a Gaussian distribution, the method 600A can proceed to operation 610.

At operation 610, a determination is made as to if or how the initial position established at operation 602 should be adjusted, and an adjustment of one or more aspects of the imaging apparatus including the initial position can be made. Subsequent to operation 608, positional feedback is transmitted to the controller and an adjustment can be determined at operation 610. The determination at operation 610 can be based on the real-time location of the exposure source as compared to a range of distance of exposure positions included in the imaging program. This can be determined by the position of the reflection of the laser beam on the sensor xp as shown and discussed in FIGS. 7A-7C below.

If the real-time position of the exposure source is within the range of exposure positions in the imaging program, no adjustment may be made at operation 610. For example, if the imaging program specifies an exposure position within ±X (vertical distance) of the top surface of the substrate, and the position indicated by the signal is within that range, then no adjustment is made to the initial position at operation 610. In this example, the method 600A moves to operation 614 and the initial position established at operation 602 can be maintained. Scanning continues for a plurality of iterations as the method 600A returns to operation 604 until the scanning of the substrate is completed at 620. During the iterations of the method 600A used for autofocusing in real-time during scanning, the same single classifier or different single classifiers can be used at operation 608 depending upon the imaging program executed at operation 602.

In operation 610, if the real-time position of the exposure source is outside of the range of exposure positions, an adjustment of the relative position or distance between the stage the exposure source can be made. In further examples, imaging parameters such as scanning rate and/or intensity of the exposure can be adjusted at operation 610 or maintained at operation 614 in addition to or instead of the exposure position. In another example, when it is determined that a first signal analyzed at operation 608 is associated with a first class of substrate composition ("first class") based on the use of the first classifier, the method proceeds to operation 610. In this example, the first class is associated with a substrate composition of a photoresist formed over a transparent material. In another example, a determination is made based on the imaging program as to how to adjust the initial position.

In one example, at operation 608 the signal is determined to have been received from the top surface of the photoresist on the substrate. In this example, the imaging program indicates that the position of the substrate/stage relative to the exposure source as indicated by the signal analyzed is within a predetermined distance between the substrate/stage and exposure source stored in the imaging program, and no adjustment need be made at operation 610. In another example, it is determined, based on the analysis at operation 608, that the position of the substrate/stage relative to the exposure source is outside of the predetermined distance between the substrate/stage and exposure source stored in the imaging program. In such an example, an adjustment of the stage or exposure source positions(s) may be made at operation 610.

The method 600A is executed in real-time during scanning, thus, subsequent to operation 610, the method 600A returns to operation 604 and continues scanning across the substrate until the imaging program has completed its execution and patterned the substrate at operation 620. Subsequent to operation 620, the substrate is removed from the imaging apparatus and a second substrate is positioned in the imaging apparatus. The method 600A can then be executed again while the second substrate is positioned in the imaging apparatus for patterning.

The determination at operation 610 can employ the z-axis data from the signal to determine what, if any, adjustment is to be made to the initial position established at operation 602. This determination can be made based upon one or more elements of the imaging program. Imaging parameters that can be adjusted at operation 610 include the scanning intensity and scanning velocity. In another example, the imaging program specifies an exposure position within ±X of the top surface of the substrate. If the position indicated by the analysis of the signal is not within the exposure position range, an adjustment is made to the initial position at operation 610 to change at least one parameter of the imaging apparatus. The at least one parameter adjusted at operation 610 can include a second position, a second velocity, and/or a second intensity that is/are different that the apparatus parameters established at operation 602.

In an example where method 600A determines that the signal is associated with a class of substrate that is associated with reflection noise, the signal is deemed to be corrupted (e.g., because of the subsurface layers and the noise generated by the reflection). In such examples, no positional feedback is transmitted to the controller. The method 600A is a continuous method that executes during scanning, thus, the method 600A continues scanning the substrate until the imaging program completes scanning at operation 620.

As discussed above, the imaging apparatus can be configured to recognize one or more classes using classifiers. The classes can include a first class associated with a first location on the top surface of the substrate where there is a photoresist over glass, a second class of substrate composition associated with a second location on the substrate where a photoresist is formed over a uniform reflective metallic, a third class associated with a third location on the substrate where a photoresist is formed over a different material or topography (geometry of subsurface features) that does not distort the signal, (e.g., such as a dielectric material or an optically transparent material), and a fourth class associated with a fourth location on the substrate where the photoresist is formed over an interfering topography, for example, a subsurface feature that is narrower than the beam or that has a multi-plane geometry such as a corner where the feature is contacted by the laser beam.

FIG. 6B shows a method 600B which uses an imaging program including multiple classifiers to autofocus the imaging apparatus, in contrast to the single classifier used in the method 600A. The method 600B is similar to the method 600A in FIG. 6A with respect to operations 602, 604, and 606. At operation 612 of the method 600B, subsequent to operation 608, a transformation is performed on at least a portion (e.g., a first hump) of the signal to enable further analysis. In one example, the type of transformation at operation 612 can be selected based on one or more classifier included in the imaging program loaded at operation 602. In another example, the transformation executed at 612 can be selected based on other information included in the imaging program. The transformation at operation 612 can include a neutral transformation (where the signal is not modified) or a transformation based on a derivative operator. Transformations can be used on single peak or multi-peak signals. Multi-peak signals include "humps" which can be transformed into peaks as shown and described in FIGS. 7B-7C. The transformation at operation 612 can be achieved by taking a derivative of the signal so that a hump are transformed into peaks that can be analyzed using the method 600B.

At operation 616, subsequent to the transformation at operation 612, a peak detection and extraction occurs. Operation 616 can be executed to (1) locate a first peak, such as 704A in FIG. 7C, if the signal includes a plurality of peaks, and (2) compute shape descriptors for the first peak to be used by a subsequent shape descriptor classification at operation 618. Operation 616 can further include (3) an output of a plurality of values for shape descriptors associated with the first peak as well as the location of the first peak as received by the sensor. The location of the first peak at operation 616 can be based on one or more shape descriptors, such as a convexity of the first peak and/or a proximity of the first peak to the start of the signal (xp in FIG. 7C).

Depending on the embodiment, operation 616 can be repeated one or more times to extract one or more peaks. In one example, a second peak is extracted at operation 616 subsequent to the first peak if it is determined that the first peak does not meet either of the convexity or the proximity with respect to the start of the signal. In one example, the second peak is extracted at operation 616 in response to a determination that the first peak does not meet both of the convexity or the proximity with respect to the start of the signal. A number of peaks analyzed at operation 616 can be determined based on the imaging program.

At operation 618, subsequent to the extraction of at least a first peak at operation 616, an analysis is executed that can be referred to as a multi-classifier operation. Operation 618 is similar to operation 608 except that an imaging program including multiple (two or more) classifiers to be used to determine when a peak is associated with a class. Each classifier used at operation 618 can include one or more shape descriptors, and the classifiers can be evaluated in series or in parallel on a single peak or on multiple peaks subsequent to extraction.

In one example at operation 618, a peak extracted at operation 616, for example, the first peak, has one or more classifiers applied in series to determine if the first peak falls into the first, second, third, fourth, or another class. Operation 618 can be employed to qualify, recognize, or reject a first peak from operation 616 by sequentially comparing a plurality of shape descriptors and/or other factors. In an example where a signal includes multiple peaks, and more than one peak is determined at operation 618 to be associated with the first class (i.e., photoresist formed over the substrate), the peak closest to the start of the signal can be used to determine the position of the imaging apparatus. The peak closest to the start of the signal may be used because the first peak corresponds to the top surface of the substrate, whereas peaks to the right of the first peak may be associated with sub-layers underneath the top surface. One or more peaks can be extracted at operation 616 to determine the class at operation 618.

In one example, machine learning is employed at operation 618 and a weighted sum structure is used. In this example, at least one classifier includes shape descriptors that are associated with different weights, and a sum total of the weighted values can be used to determine whether the signal is associated with a class associated with the at least one classifier. If it is determined at operation 618 that the first peak is not associated with a predefined class of substrate composition, the method can return to operation 616 where a second peak is extracted and at least operations 616 and 618 are repeated. In some examples, at operation 618, the initial scanning position can be maintained when a first peak or when a predetermined number of peaks fail to fall into any of the defined classes.

At operation 610, a determination is made as to whether one or more parameters of the imaging apparatus, such as the initial position, established at operation 602 are adjusted as well as how the parameter(s) is adjusted. In one example, operation 610 is employed when it is determined at operation 618 that the signal received from and thus associated with a top photoresist surface of the substrate. As discussed above with respect to the method 600A, the determination at operation 610 can be based on the real-time location of the exposure source as compared to the imaging program that includes a range of distance of exposure positions. In one example, the real-time position of the exposure source is within the range of exposure positions in the imaging program. In this example, no adjustment may be made at operation 610 and the method 600B proceeds to operation 614 where the initial position can be maintained. The method 600B returns to operation 604 until the scanning is completed at 620. During the iterations of the method 600B used for autofocusing in real-time during scanning, the same single classifier or different single classifiers can be used at operation 608 depending upon the imaging program executed at operation 602.

The determination at operation 610 subsequent to operation 618 can employ the z-axis data from the signal to determine what, if any, adjustment is to be made at operation 610 to the initial position established at operation 602. This determination can be made based upon one or more elements of the imaging program. In one example, if the imaging program specifies an exposure position within ±X of the top surface of the substrate, and the position indicated by the signal is within that range, then no adjustment is made to the initial position at operation 610. Other imaging parameters that can be adjusted in a similar fashion at operation 610 include the scanning intensity and scanning velocity. In another example, the imaging program specifies an exposure position within ±X of the top surface of the substrate. If the position of the exposure source as indicated by the analysis of the signal is not within that range, an adjustment is made to the initial position at operation 610 to change the apparatus to a second position, a second velocity, and/or a second intensity that is/are different that the apparatus parameters established at operation 602.

In examples where method 600B determines that the signal is associated with a class that is associated with reflection noise, the signal is deemed to be corrupted (e.g., because of the subsurface layers and the noise generated by the reflection), and no positional feedback is transmitted to the controller. The method 600B is a continuous method that executes during scanning, thus, the method continues scanning the substrate until the imaging program has completed its execution and patterned the substrate at operation 620.

FIG. 6C is a flow chart of the method 600C. The method 600C is similar to the method 600A in FIG. 6A with respect to operations 602, 604, 606, and 608. However, in contrast to the method 600A, subsequent to operation 608 in the method 600C, the signal can be transformed at operation 612. Operation 612 in the method 600C can be similar to operation 612 as discussed in FIG. 6B in the method 600B. In an example of the method 600C, when it is determined at operation 608 that the signal is not associated with a class, or that the signal is not a Gaussian distribution, the method 600C proceeds to operation 612. Operations 612, 616, and 618 in FIG. 6C are similar to operations 612, 616, and 618 discussed above in the method 600B. Instead of stopping scanning or adjusting the initial position established at operation 602, operation 612 executes a transformation on the signal. In one example, the transformation can be selected based on the single classifier executed at operation 608. In another example, the transformation executed at operation 612 can be selected based on other factors including information included in the imaging program. As discussed above, the transformation at operation 612 can include a neutral transformation or a transformation that includes a derivative operator where the derivative of a first hump.

In one example, at operation 612, the transformation can occur in response to a determination at operation 608 that the laser(s) are reflecting off of a sub-surface material underneath the photoresist that is distorting the signal. This may occur, for example, if the signal includes a plurality of humps and/or peaks, or is otherwise a non-Gaussian distribution. The transformation at operation 612 can be achieved by taking a derivative of the signal so that a hump such as those shown and discussed in FIGS. 7B-7C are transformed into peaks that can be analyzed using the method 600B. Operation 612 can include a selector operation that determines an appropriate shape transformation, which can be based on the specification and/or other portions of an imaging program. In one example, operation 612 determines the shape transformation based on the one or more shape descriptors used, for example, at operation 608.

At operation 616, subsequent to the transformation at operation 612, a peak detection and extraction occurs. Operation 616 can be executed in one or more iterations in a similar manner to that described above in the method 600B. At operation 618, subsequent to the extraction of at least a first peak at operation 616, an analysis is executed that can be referred to as a multi-classifier operation. Operation 618 can be executed in the method 600C in a similar manner to what is described in the method 600B in FIG. 6B. Subsequent to and based on operation 618, a determination of whether there is an adjustment made to the imaging apparatus, as well as what type of adjustment and the degree/extent of that adjustment, is made at operation 610. In some examples, the initial scanning position is maintained at operation 614 and the method returns to operation 604 to continue scanning. Operations 610 and 614 can be executed in the method 600C in a similar manner to that described in the methods 600A and 600B.

In an example where method 600C determines that the signal is associated with a class that is associated with reflection noise, the signal is deemed to be corrupted. In this example, no positional feedback is transmitted to the controller, and the initial exposure position is maintained at operation 614. The method 600C is a continuous method that executes during scanning, thus, the method continues scanning the substrate until the imaging program has completed its execution and patterned the substrate at operation 620.

Figure 7A:
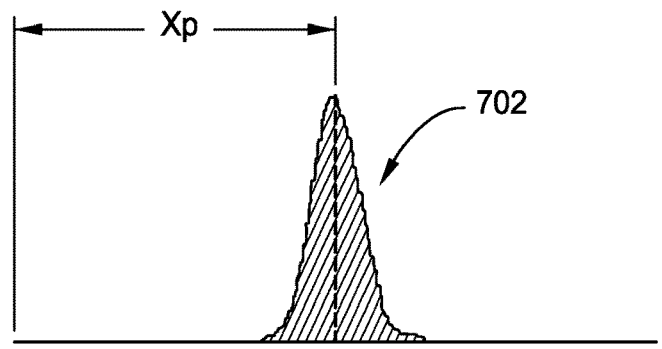
FIG. 7A is an example signal of a first class of substrate composition according to embodiments of the present disclosure.
Figure 7B:
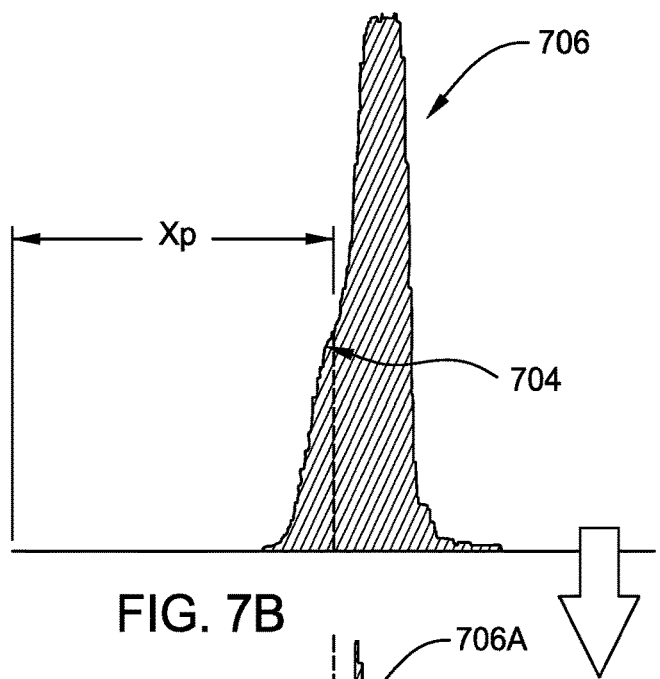
FIG. 7B is an example signal of a second class of substrate composition according to embodiments of the present disclosure.
Figure 7C:
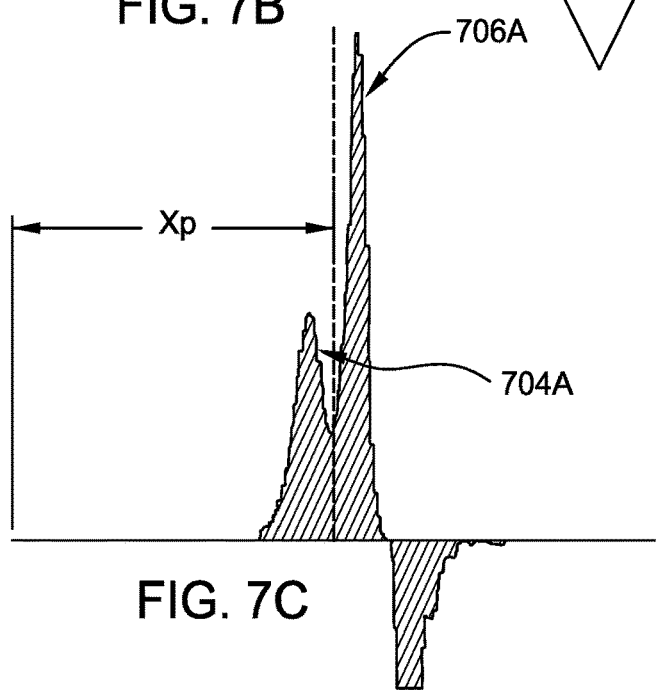
FIG. 7C is an example of a transformation of the second class signal of FIG. 7B.

FIG. 7A is an example signal of a first class when the laser beam is focused on a photoresist-only location on a substrate. FIG. 7A shows a peak 702, which is a location of the signal on the sensor xp (e.g., where on the sensor the signal was received). In FIG. 7A, the location of the beam on the sensor xp is at the peak 702. FIG. 7B is an example signal of a second class and FIG. 7C is an example of a transformation of the second class signal of FIG. 7B. In particular, FIG. 7C is an example of when the laser beam is focused on a substrate location that includes the photoresist disposed over at least one metallic material.

The signal of FIG. 7B includes a first hump 704 and a second hump 706. The first hump 704 can indicate a location on the substrate where the reflection of the laser is from the photoresist. The second hump 706 can indicate a reflection from metallic material underlying the photoresist in the location of the substrate. Signals such as those shown in FIG. 7B can be generated when the laser(s) are reflected from patterned features, edges of patterned features, and/or other locations on the substrate where the photoresist is formed over metallic features.

FIG. 7C shows the transformation of the signal in FIG. 7B, similar to what is discussed at operation 612 in methods 600B-600C above. As shown in FIG. 7C, the first hump 704 from FIG. 7B is transformed into first peak 704A and the second hump 706 is transformed into second peak 706A. The sensor xp in FIG. 7C, in contrast to the sensor xp in FIG. 7A, is not the distance from the start of the signal to the peak, but rather indicates that the beam is located at the minimum or first valley after the first peak 704A. The signal in FIG. 7C can be subsequently analyzed as discussed in the methods 600A, 600B, and 600C. FIGS. 7A and 7B are signals received by the sensor(s) during scanning of a substrate, thus, one or more of the methods 600A, 600B, and 600C are executed to determine if the exposure position of the imaging apparatus is such that an in-focus position is maintained during scanning to perform in-focus exposures.

As such, using the systems and methods discussed herein, the position of the substrate during scanning in the imaging apparatus can be adjusted based upon the distance from the substrate surface to the exposure source. By determining when the laser beams are reflecting off of the top substrate surface (photoresist) and when the signals indicate that the reflections may have been distorted as compared to a reflection from a photoresist due to the underlying materials, adjustments are not made in response to noise in the signals, thus generating an in-focus exposure across the substrate.

The autofocusing discussed herein allows for the continual adjustment of an imaging system during scanning while patterning the substrate to prevent mura formation. The real time analysis and adjustment produces an optimal, focused, exposure for the substrate during the patterning process. When focus beams such as laser beams are used to determine a position of the exposure source, a difference in the reflection received by sensors will occur in response to the reflection of the laser beams off of the photoresist and/or the metallic materials. Based on the difference in the reflection received by the sensors, adjustments can be made in real time based on the class of substrate composition to ensure the substrate remains in-focus.

Using the systems and methods discussed herein, a substrate positioned in an imaging apparatus in an initial position is exposed to the exposure source (i.e., the substrate is patterned). The initial position is an exposure position and can be determined based on imaging programs. Whether or not the imaging apparatus is to be adjusted during scanning to maintain focus on the substrate can be determined using the systems and methods discussed herein. The signals received by the sensors can contain one or more peaks, and can be characterized based upon the shape descriptors for at least one peaks. Depending upon the embodiment, the stage and/or the exposure source can be adjusted along one or more axis to a second position from the initial position subsequent to and/or during execution of the methods discussed herein.

While the foregoing is directed to embodiments of the present invention, other and further embodiments of the invention may be devised without departing from the basic scope thereof, and the scope thereof is determined by the claims that follow.

What is claimed is:

1. A method of patterning a substrate using an imaging apparatus, comprising:
    applying, based on an imaging program stored in a non-transitory memory of the imaging apparatus and executable by a processor, a plurality of laser beams from the imaging apparatus across at least a portion of a substrate, the substrate being in an initial position, wherein the substrate comprises one or more layers;
    receiving, by a plurality of sensors of the imaging apparatus, in response to applying the plurality of laser beams, a plurality of signals reflected off of the substrate, each signal being defined by a plurality of shape descriptors, wherein one or more shape descriptors of the plurality of shape descriptors are associated with features of subsurface layers of the substrate;
    determining which layer of the one or more layers of the substrate a first signal of the plurality of signals is received from by analyzing the plurality of shape descriptors; and
    performing at least one of the following actions:
        in response to the determination that the first signal was distorted by subsurface features and therefore received from a subsurface layer and not from a top surface of the substrate, maintaining an initial position of a stage;
        in response to the determination that the first signal was distorted by subsurface features and therefore received from a subsurface layer and not from the top surface of the substrate, transforming the first signal;

in response to the determination that the first signal was not distorted by subsurface features and therefore received from the top surface of the substrate, adjusting the initial position of the stage to a second position; or in response to the determination that the first signal was not distorted by subsurface features and therefore received from the top surface of the substrate, maintaining the initial position of the stage.

2. The method of claim 1, wherein the imaging program comprises at least one classifier, wherein the at least one classifier is associated with a class of a plurality of classes of substrate composition, and wherein determining if the first signal of the plurality of signals was received from the top surface of the substrate comprises applying the at least one classifier to the first signal.

3. The method of claim 2, wherein the plurality of shape descriptors comprise one or more of an amplitude, a width, a height, a symmetry along a y-axis, a fill ratio, a skewness, a peak position relative to a signal start, a peak convexity, or an area under a curve, and wherein the at least one classifier includes at least one shape descriptor.

4. The method of claim 2, wherein the initial position of the stage is adjusted to the second position when the imaging program determines the position of the substrate or the stage as indicated by the first signal is outside a predetermined distance between the substrate or the stage and an exposure source.

5. The method of claim 2, wherein the plurality of classes of substrate composition comprise a first class associated with a first location on the top surface of the substrate where a photoresist is disposed over glass, a second class associated with a second location of the substrate where a photoresist is formed over a uniform reflective metallic, a third class associated with a third location of the substrate where a photoresist is formed over a non-interfering material or topography that does not distort the signal, and a fourth class associated with a fourth location of the substrate where the photoresist is formed over a signal-interfering topography or material.

6. The method of claim 2, wherein the at least one classifier comprises a first shape descriptor and a second shape descriptor,
  wherein each of the first shape descriptor and the second shape descriptor is associated with a different weighting, and
  wherein the determining if the first signal is received from the top surface of the substrate is based on a sum of a first weighted value for the first shape descriptor based on a first weighting and a second weighted value for the second shape descriptor based on a second weighting.

7. The method of claim 2, further comprising:
  prior to determining which layer of the one or more layers of the substrate the first signal is received from, selecting a shape transformation to execute on the first signal;
  executing the selected shape transformation on the first signal; and
  extracting a first peak from the first signal, wherein determining if the first signal is associated with the top surface of the substrate comprises applying the at least one classifier to the first peak.

8. The method of claim 7, further comprising:
  extracting a second peak from the first signal;
  determining if the second peak of the plurality of signals is received from the top surface of the substrate by applying the at least one classifier to the second peak; and at least one of:
  in response to the determination indicating that the second peak was not received from the top surface of the substrate, maintaining the initial position of the stage;
  in response to the determination indicating that the second peak was not received from the top surface of the substrate, transforming the second peak;
  in response to the determination indicating that the second peak was received from the top surface of the substrate, adjusting the initial position of the stage to a second position; or
  in response to the determination indicating that the second peak was received from the top surface of the substrate, maintaining the initial position of the stage.

9. The method of claim 1, wherein the imaging program is associated with one or more of a photoresist type, an average photoresist thickness, a maximum photoresist thickness, a composition of at least one material underlying the photoresist, a thickness of the at least one material underlying the photoresist, or a part number associated with an intermediate or a final product including the substrate.

10. The method of claim 1, further comprising establishing the initial position based on the imaging program, the imaging program including a plurality of operational settings selected from the group consisting of scanning rate, scanning direction, exposure intensity, an exposure position, and a scanning time.

11. A method of patterning a substrate using an imaging apparatus, comprising:
  applying, based on an imaging program executed by a processor of the imaging apparatus, a plurality of laser beams from the imaging apparatus across at least a portion of a substrate while the substrate is in an initial position, the substrate comprising one or more layers;
  receiving, by a plurality of sensors coupled to the imaging apparatus, in response to applying the plurality of laser beams, a plurality of signals reflected off of the substrate, each signal being defined by a plurality of shape descriptors and including at least one peak, wherein one or more shape descriptors of the plurality of shape descriptors are associated with features of subsurface layers of the substrate;
  applying a first classifier from the imaging program to a first signal of the plurality of signals to determine if the first signal is associated with a first class of a plurality of classes of substrate composition, wherein the first class of the plurality of classes is associated with a top surface of the substrate;
  applying a second classifier from the imaging program to the first signal to determine if the first signal is distorted by subsurface features and therefore associated with a second class of the plurality of classes of substrate composition, wherein the second class of the plurality of classes is associated with a subsurface layer; and
  based upon the applying of the first classifier and the second classifier to the first signal, performing at least one of the following actions:
    in response to a determination that first signal is distorted by subsurface features and therefore associated with the second class, maintaining the initial position of the substrate; or
    in response to a determination that first signal is associated with the first class, determining if a location of the top surface of the substrate is within a predetermined distance range from an exposure source.

12. The method of claim 11, further comprising:
in response to the determination that the location of the top surface of the substrate relative to the exposure source is outside of the predetermined distance range, adjusting the initial position to a second position; or
in response to the determination that the location of the top surface of the substrate relative to the exposure source is inside of the predetermined distance range, maintaining the initial position of the substrate.

13. The method of claim 11, wherein the plurality of shape descriptors comprise: an amplitude, a width, a height, a symmetry along a y-axis, a skewness, a peak position relative to a signal start, a peak convexity, or an area under a curve.

14. The method of claim 11, wherein the first class is associated with a first substrate composition consisting of a photoresist formed over optically transparent material.

15. The method of claim 11, wherein the second class is associated with a second substrate composition comprising a photoresist formed over a metallic material or a dielectric material.

16. The method of claim 11, wherein the imaging program is associated with at least two of a photoresist type, an average photoresist thickness, a maximum photoresist thickness, a composition of at least one material underlying the photoresist, a thickness of the at least one material underlying the photoresist, and a part number associated with an intermediate or a final product including the substrate.

17. A non-transitory computer-readable medium including instructions that are configured to cause a computing system to:
apply a plurality of laser beams from an imaging apparatus across at least a portion of a substrate, the substrate being disposed on a stage in an initial position, the imaging apparatus being communicatively coupled to the computing system, wherein the substrate comprises one or more layers;
receive, by a plurality of sensors of the imaging apparatus, in response to applying the plurality of laser beams, a plurality of signals reflected off of the substrate, each signal being defined by a plurality of shape descriptors, wherein one or more shape descriptors of the plurality of shape descriptors are associated with features of a subsurface layer;
determine if a first signal of the plurality of signals is associated with a first class of a plurality of classes by analyzing the plurality of shape descriptors and determining whether the first signal is distorted, wherein each class of the plurality of classes is associated with a composition of the substrate;
wherein the instructions are further configured to cause the computing system to execute at least one of the following actions:
maintain the initial position of the substrate in response to the determination indicating that the first signal is distorted by subsurface features and therefore received from a subsurface layer of the substrate associated with a second class different than the first class;
transform the first signal in response to the determination indicating that the first signal is associated with the second class different than the first class; or
adjust the initial position of the substrate to a second position in response to the determination indicating that the first signal is not distorted by subsurface features and therefore received from a top surface of the substrate and is associated with the first class.

18. The non-transitory computer-readable medium of claim 17, wherein the instructions are an imaging program comprising at least one classifier, wherein the at least one classifier is associated with a class of the plurality of classes, and wherein determining if the first signal of the plurality of signals is associated with the first class comprises applying the at least one classifier to the first signal.

19. The non-transitory computer-readable medium of claim 17, wherein the first class is associated with a first location on the top surface of the substrate where a photoresist is disposed over glass, and
wherein the second class is associated with a second location of the substrate where a photoresist is formed over a uniform reflective metallic, associated with a third location of the substrate where a photoresist is formed over a non-interfering material or topography that does not distort the signal, or associated with a fourth location of the substrate where the photoresist is formed over a signal-interfering topography or material.

20. The non-transitory computer-readable medium of claim 17, wherein the plurality of shape descriptors comprise one or more of an amplitude, a width, a height, a symmetry along a y-axis, a fill ratio, a skewness, a peak position relative to a signal start, a peak convexity, and an area under a curve.

* * * * *